(12) United States Patent
Lu et al.

(10) Patent No.: US 11,183,440 B2
(45) Date of Patent: Nov. 23, 2021

(54) POWER MODULES FOR ULTRA-FAST WIDE-BANDGAP POWER SWITCHING DEVICES

(71) Applicant: GaN Systems Inc., Ottawa (CA)

(72) Inventors: Juncheng Lu, Kanata (CA); Di Chen, Ottawa (CA); Larry Spaziani, Chelmsford, MA (US); Peter Anthony Di Maso, Ottawa (CA)

(73) Assignee: GaN Systems Inc., Ottawa (CA)

(*) Notice: Subject to any disclaimer, the term of this patent is extended or adjusted under 35 U.S.C. 154(b) by 0 days.

(21) Appl. No.: 16/705,696

(22) Filed: Dec. 6, 2019

(65) Prior Publication Data

US 2020/0185302 A1   Jun. 11, 2020

Related U.S. Application Data

(60) Provisional application No. 62/777,357, filed on Dec. 10, 2018.

(51) Int. Cl.
*H01L 23/367* (2006.01)
*H01L 23/538* (2006.01)
(Continued)

(52) U.S. Cl.
CPC .... *H01L 23/3675* (2013.01); *H01L 23/49811* (2013.01); *H01L 23/5386* (2013.01);
(Continued)

(58) Field of Classification Search
CPC ............. H01L 23/3675; H01L 23/5386; H01L 29/7786; H01L 29/2003; H01L 25/115;
(Continued)

(56) References Cited

U.S. PATENT DOCUMENTS

| | | |
|---|---|---|
| 4,047,197 A | 9/1977 | Schierz |
| 4,965,710 A | 10/1990 | Pelly et al. |

(Continued)

FOREIGN PATENT DOCUMENTS

| | | |
|---|---|---|
| CN | 101453159 B | 6/2009 |
| CN | 102064158 B | 5/2011 |

(Continued)

OTHER PUBLICATIONS

CN102064158 EPO Bibliographic data and English Abstract, dated May 2011.
(Continued)

*Primary Examiner* — Shahed Ahmed
(74) *Attorney, Agent, or Firm* — Miltons IP/p.i.

(57) ABSTRACT

Low inductance power modules for ultra-fast wide-bandgap semiconductor power switching devices are disclosed. Conductive tracks define power buses for a switching topology, e.g. comprising GaN E-HEMTs, with power terminals extending from the power buses through the housing to provide a heatsink-to-busbar distance which meets creepage and clearance requirements. Low-profile, low-inductance terminals for gate and source-sense connections extend from contact areas located adjacent each power switching device to provide for a low inductance gate drive loop, for high di/dt switching. The gate driver board is mounted on the low-profile terminals, inside or outside of the housing, with decoupling capacitors provided on the driver board. For paralleled switches, additional terminals, which are referred to as dynamic performance pins, are provided to the power buses. These pins are configured to provide a low inductance path for high-frequency current and balance inductances of the power commutation loops for each switch.

26 Claims, 18 Drawing Sheets

(51) Int. Cl.
  *H01L 29/778* (2006.01)
  *H01L 29/20* (2006.01)
  *H01L 25/11* (2006.01)
  *H01L 23/498* (2006.01)
(52) U.S. Cl.
  CPC ........ *H01L 25/115* (2013.01); *H01L 29/2003* (2013.01); *H01L 29/7786* (2013.01)
(58) Field of Classification Search
  CPC . H01L 23/49811; H01L 25/18; H01L 25/072; H01L 23/36; H01L 23/04; H01L 23/3735; H01L 23/16–26; H01L 2924/15–17798
  See application file for complete search history.

(56) References Cited

U.S. PATENT DOCUMENTS

| | | | |
|---|---|---|---|
| 5,408,128 | A | 4/1995 | Furnival |
| 8,228,113 | B2 | 7/2012 | Domes |
| 8,736,040 | B2 | 5/2014 | Hauenstein et al. |
| 9,373,617 | B2 | 6/2016 | Das et al. |
| 9,407,251 | B1 | 8/2016 | Passmore et al. |
| 9,426,883 | B2 | 8/2016 | McPherson et al. |
| 9,773,767 | B2 | 9/2017 | Nakamura et al. |
| 10,136,529 | B2 | 11/2018 | McPherson et al. |
| 10,204,847 | B2 | 2/2019 | Cho |
| 2009/0096081 | A1* | 4/2009 | Soyano ............... H05K 7/1432 257/698 |
| 2009/0104734 | A1* | 4/2009 | Specht ................. H01L 25/072 438/117 |
| 2013/0214842 | A1* | 8/2013 | Zeng ..................... H02M 1/143 327/310 |
| 2015/0021750 | A1* | 1/2015 | Fujino ................ H01L 23/3675 257/667 |
| 2015/0131236 | A1 | 5/2015 | Passmore et al. |
| 2018/0366400 | A1* | 12/2018 | Mohn ............... H01L 23/49822 |
| 2019/0139880 | A1 | 5/2019 | Jakobi et al. |
| 2020/0279789 | A1* | 9/2020 | Williams ................ H01L 23/10 |
| 2020/0279791 | A1* | 9/2020 | Finarelli ............ H01L 23/3733 |

FOREIGN PATENT DOCUMENTS

| | | |
|---|---|---|
| EP | 2284889 A1 | 2/2011 |
| WO | 2018132649 A1 | 7/2018 |

OTHER PUBLICATIONS

CN101453159 EPO Bibliographic data and English Abstract, dated Jun. 2009.
J. Xu et al., "A Performance Comparison of GaN E-HEMTS Versus SiC MOSFETS in Power Switching Applications", Bodos Power Systems, Jun. 2017; 4 pages.
J. Lu et al., "A High Power-Density and High Efficiency Insulated Metal Substrate Based GaN HEMT Power Module" Energy Conversion Congress and Exposition (ECCE), pp. 3654-3658, Oct. 1-5, 2017.
J. Lu et al., "Parasitics Optimization for GaN HEMTs in Conventional Housing-Type Power Modules" (Article), pp. 735-741, PCIM 2019, May 7-9, 2019.
J. Lu et al.; "Parasitics Optimization for GaN HEMTs in Conventional Housing Type Power Modules" (Slides 1-23) PCIM 2019, May 4-9, 2019.
J. Lu et al.; "Hard Switching 650V GaN HEMTs in a 800V DC-Grid System with No. diode-clamping Active Balancing Three-Level Topology" in IEEE Journal of Emerging and Selected Topics in Power Electronics, vol. 7, No. 2, pp. 1060-1070, Jun. 2019 (first published by IEEE Oct. 1, 2018); doi: 10.1109/JESTPE.2018. 2873156.
J. Lu, et al.;"Opportunities and Design Considerations of GaN HEMTs in ZVS Applications", Paper No. 1213, 2018 IEEE Applied Power Electronics Conference and Exposition (APEC) Mar. 4-8, 2018; DOI: 10.1109/APEC.2018.8341117; 11 pages.
J. Lu, et al.; "Critical Transient Processes of Enhanced-mode GaN E-HEMTs in High-efficiency and High-reliability Applications", CES Transactions on Electrical Machines and Systems, vol. 1, No. 3, Sep. 2017; DOI: 10.23919/TEMS.2017.8086107; pp. 283-291.
P. Di Maso, et al.; "System Level Considerations with GaN Power Switching", 2018 IEEE Applied Power Electronics Conference and Exposition (APEC); APEC 2018 Industry Session, Mar. 7, 2018; 26 pages.
K.J. Olenjniczak; "Advanced Low-Cost SiC and GaN Wide Bandgap Inverters for Under-the-Hood Electric Vehicle Traction Drives", APEI Jun. 17, 2014; pp. 1-27.
N. Schafer; Semikron; "SEMITRANS Standard IGBT Modules" slide presentation (May 12, 2015); 32 pages.
T. McNutt; WolfspeedTM; "Advanced SiC Devices and Modules Address System Challenges", Cree Inc., (2016); 8 pages.
B. Passmore, "High-Voltage SiC Power Modules for 10-25kV Applications", Issue 1, 2016 Power Electronics Europe, www.power-mag.com; pp. 22-24.
L. Beaurenaut, "SiC-Based Power Modules Cut Costs for Battery-Powered Vehicles", Issue 3, 2018 Power Electronics Europe www.power-mag.com; 1526564789_Infinion_feature; pp. 22-25.
S. Atcitty, Sandia National Labs., "SiC Power Module" 2009 (SiC_Power_Module_SAND2009-1903P); 35 pages.
T. Yamamoto et al., Fuji Electric Co., ""PrimePACKTM" of 7th-Generation "X Series" 1,700-V IGBT Modules", 2017 pp. 214-218.
Cree, Product information CAS325M12HM2 Half Bridge Module, Rev. B, Aug. 2017; 9 pages.
CREE; Product Datasheet CAS120M12BM2 All SiC Power Half-Bridge Module v.2014; 9 pages.
Fuji Electric Co., MT5F27333 "Fuji IGBT Modules for Solar Inverter", Nov. 2017; 35 pages.
Fuji Electric Co. Product Datasheet 2MBI600VN-120-50_1736297; IGBT Module (V series); Mar. 2014; 7 pages.
Infineon; Product Brief 34mm and 62mm IGBT Modules v.May 2016 lnfineon-34mm_and_62mm_Modules-PB-v07_00-EN May 2016; 2 pages.
Infineon; Product Information Sheet Infineon-FS820R08A6P2B-DS-v03_00-EN "HybridPACKTM Drive module" v.3.0;(Mar. 9, 2017); 16 pages.
Infineon; Product Information Sheet Infineon-HybridPACK_Drive-ApplicationNotes-v01_04-EN "HybridPACKTM Drive Assembly Instruction for the HybridPACKTM Drive" Revision 1.4 (May 28, 2019); 53 pages.
Infineon; Product Information Sheet Infineon-HybridPACK_Drive-PB-v01_00-EN "HybridPACKTM Drive FS820R08A6P2B (lead type with PinFin baseplate" (2016); 2 pages.
Infineon; Product Information Sheet lnfineon-HybridPACK2_Power_Modules-PB-v01_00-EN "HybridPACKTM 2 Power Module for Hybrid- and Electric Vehicles" (Jan. 2012); 2 pages.
Infineon; "AN2012-05—62mm Modules Application and Assembly Notes" V2.0 Feb. 2013 (Infineon-AN2012_05_Mounting_Instructions_62mm-AN-v2.0-en); 32 pages.
Mitsubishi Electric; Product information sheet "7thGeneration IGBT Modules—Standard-Type" undated (copy downloaded Feb. 2018), www.MitsubishiElectric.com; 2 pages.
Microsemi; Product Information "Power Module Packages" MicroSemi_Module_Packages06-4 undated (copy downloaded Feb. 2018); p. 16.
Semikron; DataSheet_SKM350MB120SCH17 "SiC MOSFET Module"; Rev, 2.0 (May 31, 2016); 4 pages.
Semikron; DataSheet_SEMIX603GB12E4SiCp "Trench IGBT Modules"; Rev. 0.1 (Jan. 25, 2017); 6 pages.
Semikron; DataSheet_SKM500MB120SC "SiC MOSFET Module"; Rev. 0.1 (May 27, 2015); 3 pages.
Semikron; Flyer; SEMITRANS 2-9 (May 2017); 4 pages.
Semikron; Flyer; SEMITRANS 10 DPD (May 2017); 4 pages.

* cited by examiner

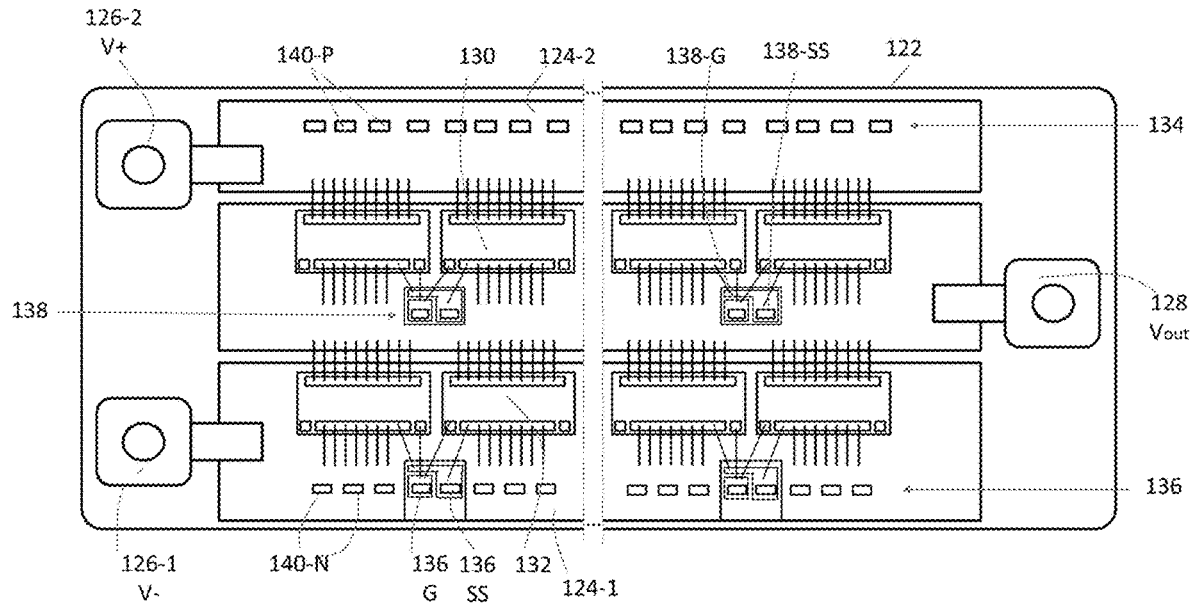

Fig. 14

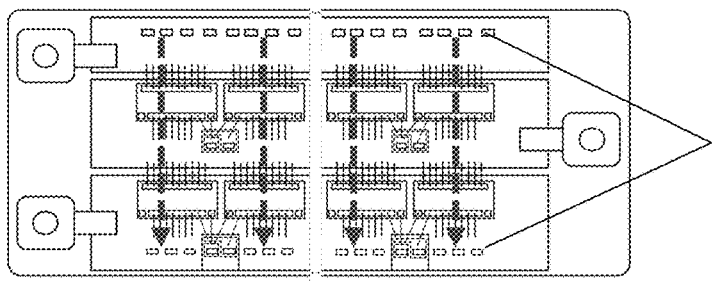

Balanced power commutation loop inductances
Multiple "dynamic pins" for each HSS/LSS provide connections from power buses to driver board for a low inductance and low resistance path for high di/dt transients in each power commutation loop

Fig. 15A

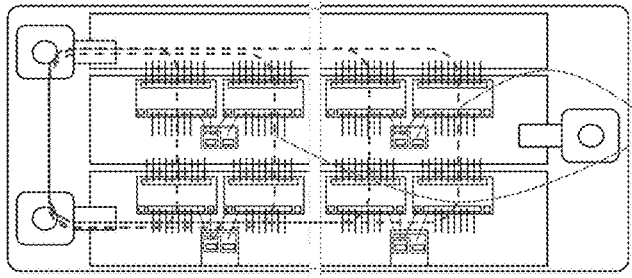

Example without "dynamic pins"; when multiple GaN HEMT switches are connected in parallel, inductances of power commutation loops are unbalanced

Fig. 15B

POWER MODULES FOR ULTRA-FAST WIDE-BANDGAP POWER SWITCHING DEVICES

CROSS-REFERENCE TO RELATED APPLICATION(S)

This application claims priority from U.S. provisional patent application No. 62/777,357 entitled "POWER MODULE FOR ULTRA-FAST WIDE-BANDGAP POWER SWITCHING DEVICES", filed Dec. 10, 2018, which is incorporated herein by reference, in its entirety.

TECHNICAL FIELD

This invention relates to power modules for ultra-fast wide-bandgap power switching devices, including power switches comprising GaN HEMTs.

BACKGROUND

High-current power devices, such as single switches and half-bridges, typically require multiple power switching devices to be mounted and interconnected in parallel within a package referred to as a power module. Many forms of power modules are known.

Industry standard power modules with 34 mm and 62 mm rectangular housings are some of the most widely used for power switches, such as half-bridges and single switches, comprising Si IGBTs or SiC MOSFETS. Since introduction of this form of power module over 25 years ago, continual improvements have been made to enhance performance of power modules, e.g., higher thermal conductivity baseplates, and reduced stray inductance and parasitic resistance, to provide higher efficiency for high-frequency switching using SiC MOSFETs. High performance SiC modules, e.g., full-bridge and half-bridge modules with SiC MOSFETs and SiC Schottky diodes, are now offered by a number of vendors.

For example, standard 62 mm power modules of conventional design are currently available for Si IGBT and SiC switching devices in the range 600V to 1700V; 20 A to 900 A; with power loop inductance in the range from about 15 nH to 25 nH. To meet creepage and clearance requirements for high voltage operation, these modules typically have a busbar-to-heatsink height of about 30 mm, i.e. the housing height between the base of the module and the power terminals. More recently, several companies have offered low-profile 62 mm power module designs having reduced heights, in the range of about 10 mm to 18 mm, e.g. to provide more compact power modules, and to provide reduced power loop inductance.

For example, U.S. Pat. No. 9,426,883B2 entitled "Low Profile, Highly Configurable, Current Sharing Paralleled Wide Band Gap Power Device Power Module", issued 23 Aug. 2016 to McPherson, and U.S. Pat. No. 10,136,529 of the same title, issued 20 Nov. 2018, disclose a 62 mm SiC power module that is about 10 mm in height. A commercially available power module of this form comprising a SiC half bridge is reported to have stray inductance of the power loop of 5 nH between power terminals 1 and 3. Although low profile modules offer reduced stray inductance of the power loop, a reduced module height necessitates creepage extenders around the power and control terminals, to meet required creepage and clearance requirements, e.g. for 1200V operation. Many existing power switching assemblies and power stacks use a standard heatsink-to-busbar spacing, e.g. 30 mm, and low profile modules cannot be easily retrofitted into such assemblies.

US2019/0139880A1 by Jakobi et al., entitled "Semiconductor Arrangement with Reliably Switching Controllable Semiconductor Elements" discloses an arrangement for a half-bridge module comprising controllable semiconductor elements having their load paths connected in parallel, to address issues relating to uneven distribution of thermal and electrical load amongst the controllable semiconductor elements.

While providing reduced stray inductance in the power loop is beneficial, another consideration is stray inductance in the gate drive loop, which introduces switching delays. This is particularly important for GaN power switching devices, which can operate at higher switching frequencies with lower switching losses than SiC MOSFETs. For example, GaN E-HEMTs can operate at switching frequencies in the range from e.g. 10 kHz to 2 MHz. Even when operating at lower switching frequencies, since turn-on and turn-off times of GaN E-HEMTs may be only a few nanoseconds, the fast switching transitions can result in very high di/dt and dV/dt values (J. Xu et al., "A Performance Comparison of GaN E-HEMTS Versus SiC MOSFETS in Power Switching Applications", Bodo's Power Systems, June 2017). Thus, reducing parasitics, such as stray power loop inductance and gate loop inductance, is an important consideration for power module design for wide bandgap semiconductor power switching devices comprising GaN HEMTs. (J. Lu et al., "A High Power-Density and High Efficiency Insulated Metal Substrate Based GaN HEMT Power Module" Energy Conversion Congress and Exposition (ECCE), pp, 3554-3658, 1-5 Oct. 2017). Housing-type power modules designed for IGBT and SiC power switching devices, provide superior thermal performance, are widely available, mature technology and cost effective, but they have significant parasitic inductance. Currently available housing-type power modules are not optimized for use with GaN power switching devices, such as high-current GaN E-HEMT half-bridges. These types of modules potentially limit performance of ultra-fast GaN switching devices.

There is a need for improved or alternative power modules for wide-bandgap semiconductor power switching devices, particularly for applications using ultra-fast switching devices, such as single switch, half bridge, full bridge and other switch topologies comprising GaN E-HEMTs.

SUMMARY OF INVENTION

The present invention seeks to provide power modules for ultra-fast wide-bandgap semiconductor switches which mitigate or circumvent one or more of the above-mentioned problems, or at least provides an alternative.

Aspects of the invention provide housing-type power modules configured for improved performance of wide-bandgap semiconductor switches, e.g. comprising GaN HEMTs. In example embodiments, power modules comprise power terminals configured to meet creepage and clearance requirements, and at least one of: gate drive terminal members configured for reduced inductance in the gate drive loop; and dynamic performance terminal members configured to reduce and balance inductance in the power power-commutation loops of parallel-connected switches. Terminal members may be arranged to minimized quasi-common source inductance.

A first aspect of the invention provides a power module for a wide-bandgap semiconductor power switching device, comprising:

a housing comprising a baseplate and a cover;
a power substrate in thermal contact with the baseplate, a topology of the power substrate being configured for mounting thereon of a wide-bandgap semiconductor power switching device, the power substrate comprising conductive tracks defining a plurality of power buses and control contact areas for the power switching device;
a plurality of power terminal members, each power terminal member electrically connected to one of the power buses and extending through the cover of the housing to a power terminal;
a plurality of terminal members comprising control terminal members extending from each of the control contact areas;
wherein each power terminal is at a first height $h_1$ from a base of the baseplate and each control terminal member extends to a control terminal at second height $h_2$ from the base, wherein the second height $h_2$ is less than the first height $h_1$.

The second height $h_2$ is selected to provide low-profile control terminals for low stray inductance of the gate drive loop for each power switching device. That is, the control terminals comprise gate and source-sense terminals for the gate drive loop of each switching device, wherein control contact areas for the gate and source-sense are located adjacent each power switching device, and the gate and source-sense terminal members extend directly from said control contact areas, and are configured to provide a low inductance signal path for the gate drive signal. For example, the low-profile control pins provide a shorter, lower inductance interconnect path to a gate driver board mounted directly on the gate and source sense pins, below the height of the power busbar connected to the power terminals. For example, the stray inductance of the gate loop may be reduced significantly relative to that of currently available power modules. Reduced stray inductance in the gate loop provides improved performance for operation at higher switching frequencies, and particularly for operation with ultra-fast switching devices, such as GaN E-HEMTs, in which turn-on and turn-off switching transitions are only a few ns, e.g. in the range from 1 ns to 10 ns, and which can operate at higher switching frequencies, e.g. in a range e.g. at switching frequencies in the range from >10 kHz to 2 MHz. For example, for high di/dt switching it may be desirable to reduce the parasitic inductance of the gate drive loop to e.g. <30 nH, <20 nH, <10 nH or <5 nH.

The first height $h_1$ is selected to meet required clearance and creepage specifications, for external power terminals, e.g. a specified heatsink-to-busbar distance. The configuration and dimensions of the power buses and power terminal members provide for a low inductance power loop.

The height difference ($h_1-h_2$) provides a space for a driver board to be connected to the control terminals, i.e. mounted below the height $h_1$ of the power terminals, inside or outside the cover of the housing. The power module may comprise a housing wherein the cover comprises a first portion and a second lower profile portion, wherein the power terminals extend through the housing at the first height $h_1$ and the control terminals extend through the lower profile portion of the housing at the second height $h_2$.

For example, in one embodiment, the cover of the housing comprises a low profile portion overlying the power switching devices, e.g. defining a recess or trough in the middle portion of the housing, with control terminals extending through the cover, so that a gate driver board can be mounted on the control terminals within the trough, e.g. mounted on the cover within an area of a footprint of the baseplate of the housing. Decoupling capacitors are mounted on the driver board.

In another embodiment, the height difference ($h_1-h_2$) provides a space for a driver board to be connected to the control terminals and mounted in a space below the height $h_1$ of the power terminals, and within the cover of the housing. Decoupling capacitors are mounted on the driver board.

While wide-bandgap switching devices comprising SiC MOSFETS are typically mounted on the power substrate as bare die, GaN power switching devices are typically pre-packaged, e.g. encapsulated in low inductance packaging. Thus, to accommodate GaN switching devices, the second height $h_2$ provides clearance above the power substrate to accommodate encapsulated semiconductor power switching devices mounted on the power substrate.

Thus, power modules of example embodiments provide reduced gate loop inductance with arrangement of shorter, "low profile" low-inductance gate and source sense terminal pins, and allow for the driver board to be directly mounted in close proximity, on or in the housing, while retaining standard creepage and clearance requirements for power terminals.

In an embodiment, the power module may have a footprint similar to a conventional power module, e.g. a 62 mm module, which has a generally rectangular baseplate, having a width and length. The power terminals may be placed at each end of the module and low-profile control terminals are arranged lengthwise along a lower profile middle portion of module, and mounting holes are provided at each end of the module so that the module can be bolted to an underlying substrate comprising a heatsink.

The topology of the power substrate may be configured for mounting thereon of a power switching device comprising a single wide-bandgap power switching device or a plurality of wide-bandgap power switching devices. For example, the power substrate topology may be configured for a single switch, a half-bridge, a full-bridge, or other switch topology. For example, the wide-bandgap semiconductor switching device(s) comprises one of a single switch GaN HEMT, a plurality of a GaN HEMTs, a plurality of GaN HEMTs configured in a half-bridge topology, full-bridge switching topology and other well-known switching topologies. For high current applications, multiple GaN HEMTs may be connected in parallel for each switch position. Thus, another aspect of the invention provides a power module for a wide-bandgap semiconductor switching device comprising:

a housing comprising a baseplate and a cover, the baseplate defining a footprint of generally rectangular form comprising ends having a width and sides having a length;
a power substrate in thermal contact with the baseplate, a topology of the power substrate being configured for mounting thereon of a plurality of wide-bandgap semiconductor power switching devices arranged as first and second rows extending along a length of the power substrate, the first row comprising high-side device positions and the second row comprising low-side device positions;
the power substrate comprising an arrangement of conductive tracks defining a plurality of power buses and a plurality of control contact areas for the plurality of semiconductor switching devices, wherein:
the power buses extend lengthwise adjacent to said first and second rows of high-side and low-side device positions;

first and second rows of control contact areas are arranged adjacent to the first and second rows of high side and low side device positions;
a plurality of power terminal members, each power terminal member extending from one of the power buses on the power substrate, through a cover of the housing, to a power terminal at a first height $h_1$ from a base of the baseplate;
a plurality of terminal members comprising control terminal members, each control terminal member extending from one of the control contact areas to a second height $h_2$ above the base, wherein $h_2$ is less than $h_1$.

The control terminals comprise gate and source-sense terminals for each power switching device, and $h_2$ is selected to provide low-profile control terminals for low stray inductance of a gate drive loop for each power switching device. The control contact areas for the gate and source-sense of each power switching device are located adjacent each power switching device and the gate and source-sense terminals extend directly from said control contact areas to provide a low inductance signal path for a gate drive signal. The power terminals are positioned at a height $h_1$, to meet required creepage and clearance requirements, such as a heatsink-to-busbar distance for high voltage operation, e.g. in a range of 300V to 400V, ≥600V or ≥1200V.

For example, the topology of the power substrate may be configured for a single switch, half bridge or full bridge switching topology. For a half-bridge topology, the first and second rows of device mounting positions allow for multiple power switching devices to be interconnected in parallel with low inductance interconnections and the conductive tracks defining the power buses on the power substrate are configured to provide low inductance interconnections between the power terminals and the power switching devices. The control terminals for the gate and source-sense connections for each power switching device are configured for low stray inductance in the in the gate drive loop. For a full-bridge topology, the power switching device positions and control contact areas are configured accordingly, and the power substrate comprises another power bus connected to a fourth power terminal.

In some embodiments comprising paralleled switches, in addition to the gate drive terminals, i.e. source sense and gate terminal pins, an arrangement of additional terminal members is provided on the power buses, for connection to the gate driver board, to provide a low inductance path for high frequency current, i.e. for high di/dt switching transients, and to balance inductances in the power commutation loops of each switch. These additional terminal members are referred to as dynamic performance terminal members, e.g. dynamic performance pins.

The baseplate and power substrate may comprise layers of a multilayer metal/ceramic substrate, such as direct copper bonded substrate, which can be bolted to an underlying heatsink in a conventional manner, e.g. through mounting holes at each end or at each corner of the baseplate.

For example, in one embodiment, the baseplate topology pattern has dimensions fitting a standard 62 mm power module pattern having a width of 62 mm and a length of 107 mm, with M6 mounting holes spaced 48 mm×93 m apart. For example, the power terminals extend through end portions of the cover at a first height $h_1$ e.g. in a range from 14 mm to 30 mm and the second height $h_2$ of the housing is ≤4 mm. The height difference $h_1-h_2$ provides a space to accommodate a driver board mounted on or in the recess or trough formed by the low-profile middle portion of the housing.

The low-profile middle portion of the housing allows for a plurality of shorter, high di/dt terminal pins for the gate drive connections, i.e. comprising gate terminals and source-sense terminals for each switching device, to be arranged along each side of the module, for reduced stray inductance in the gate drive loop, and for improved gate drive phase equalization to multiple paralleled power switching devices.

Another aspect of the invention provides an assembly of a power module comprising at least one power wide-bandgap power switching device with a driver board comprising gate driver circuitry for each power switching device, wherein the gate driver board is mounted on control terminals of the power module interconnected with corresponding connectors of the gate driver board. Beneficially, e.g. for improved reliability, decoupling capacitors, such as low profile ceramic capacitors, are provided on the gate driver board instead of within the power module.

Yet another aspect of the invention provides a power module for a wide-bandgap power semiconductor switch comprising:
a housing comprising a baseplate and a cover, the baseplate defining a footprint of generally rectangular form comprising ends having a width and sides having a length;
a power substrate in thermal contact with the baseplate, a topology of the power substrate being configured for mounting thereon of a plurality of wide-bandgap semiconductor power switching devices arranged as first and second rows extending along a length of the power substrate, the first row comprising high-side device positions and the second row comprising low-side device positions;
the power substrate comprising an arrangement of conductive tracks defining a plurality of power buses and a plurality of gate drive contact areas for the plurality of semiconductor switching devices, wherein:
the power buses extend lengthwise adjacent to said first and second rows of high-side and low-side device positions;
first and second rows of gate drive contact areas are arranged adjacent to the first and second rows of high side and low side device positions;
plurality of power terminal members, each power terminal member extending from one of the power buses on the power substrate, through a cover of the housing, to a power terminal at a height $h_1$ from a base of the baseplate that meets creepage and clearance requirements;
a plurality of gate drive terminal members, each gate drive terminal member extending from one of the gate drive contact areas through the cover of the housing; and
a plurality of dynamic performance terminal members extending from the power buses, adjacent each power switching device, the dynamic performance terminal members being arranged to provide a low inductance path for high frequency current and balance power commutation loops of each power switching device.

In some embodiments, the gate drive terminals comprise gate and source-sense terminals for each power switching device which extend to a height $h_2$, which is less than $h_1$ to provide low-profile terminals for low stray inductance of the gate drive loop for each power switching device, and the plurality of dynamic performance terminal members extend to height $h_2$ to provide low-profile terminals for low stray inductance of the power commutation loop for each switching device.

In another aspect, a power module comprises:
a housing comprising a baseplate and a cover, the baseplate defining a footprint of the power module;
a power substrate in thermal contact with the baseplate, a topology of the power substrate being configured for mounting thereon of a plurality of wide-bandgap semiconductor power switching devices arranged as first and second rows extending along a length of the power substrate, the first row comprising high-side device positions and the second row comprising low-side device positions;

the power substrate comprising an arrangement of conductive tracks defining a plurality of power buses, wherein:

the power buses extend lengthwise adjacent to said first and second rows of high-side and low-side device positions;

first and second rows of contact areas are arranged adjacent to the first and second rows of high side and low side device positions, the contact areas comprising gate drive contact areas each the plurality of semiconductor switching devices;

a plurality of power terminal members, each power terminal member extending from one of the power buses on the power substrate, to a power terminal at a first height from the baseplate;

a plurality of gate drive terminal members, each gate drive terminal member extending from one of the gate drive contact areas to a second height from the baseplate for connection to a gate driver board; and a plurality of dynamic performance terminal members extending from the power buses, adjacent each power switching device, for connection to the gate driver board, the dynamic performance terminal members having an arrangement that balances inductances of power commutation loops of each power switching device and provides a low inductance path for high frequency current.

Power modules of embodiments described herein are applicable for high-speed, wide-bandgap, power switching devices, e.g. using SiC or GaN technologies, for switching frequencies ≥10 kHz. Module designs that offer reduced stray inductance of the gate drive loops and the power commutation loops, compared to conventional known housing-type modules, are particularly applicable for ultra-fast power switching devices comprising GaN HEMTs, in which high di/dt and dV/dt switching transitions take place on a ns time scale, and which are capable of operating at higher switching frequencies, e.g. in a range from ≥10 kHz to 2 MHz. Power modules of embodiments may be configured to provide separation of high frequency signal paths of the gate drive loop and lower frequency signal paths of the power loop, to reduce interference. For example, an arrangement of dynamic performance terminals, or "dynamic pins", provide for distributed power connections from the power buses to the driver board, to provide for balancing of power commutation loops of multiple paralleled switching devices. In some embodiments, the power terminals have a height that meets creepage and clearance requirements, while the gate drive terminal pins and the dynamic performance terminal pins are low-profile pins, to provide for low inductance connections to the driver board. The driver board may be mounted in a low profile trough on the exterior of the housing or within the housing, and decoupling capacitors are mounted on the driver board.

Thus, power modules for wide-bandgap semiconductor power switching devices are provided for applications using, such as single switch, half bridge, full bridge and other switch topologies, with particular application to ultra-fast wide-bandgap semiconductor power switching devices comprising GaN E-HEMTs.

BRIEF DESCRIPTION OF THE DRAWINGS

FIG. 14 shows a schematic plan view of the layout of components of the power module of the first embodiment, as shown FIGS. 7 to 9;

FIG. 15A shows an annoted schematic plan view of components of the power module of the first embodiment;

FIG. 15B shows an annoted schematic plan view of components of a power module of a third embodiment;

The foregoing and other objects, features, aspects and advantages of the present invention will become more apparent from the following detailed description, taken in conjunction with the accompanying drawings, of some embodiments of the invention, which description is by way of example only.

DETAILED DESCRIPTION

Figure 1:
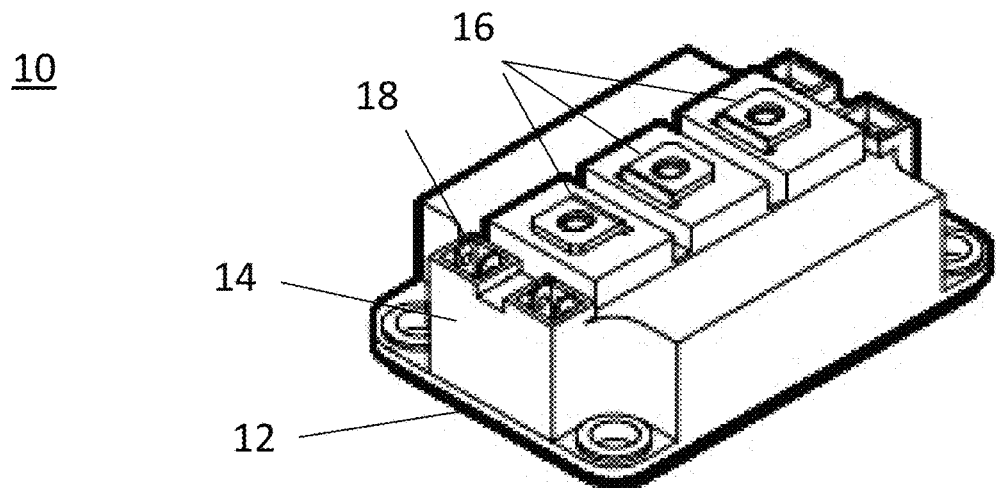
FIG. 1 (Prior Art) shows a schematic line drawing of an example of an industry standard power module design.
Figure 2:
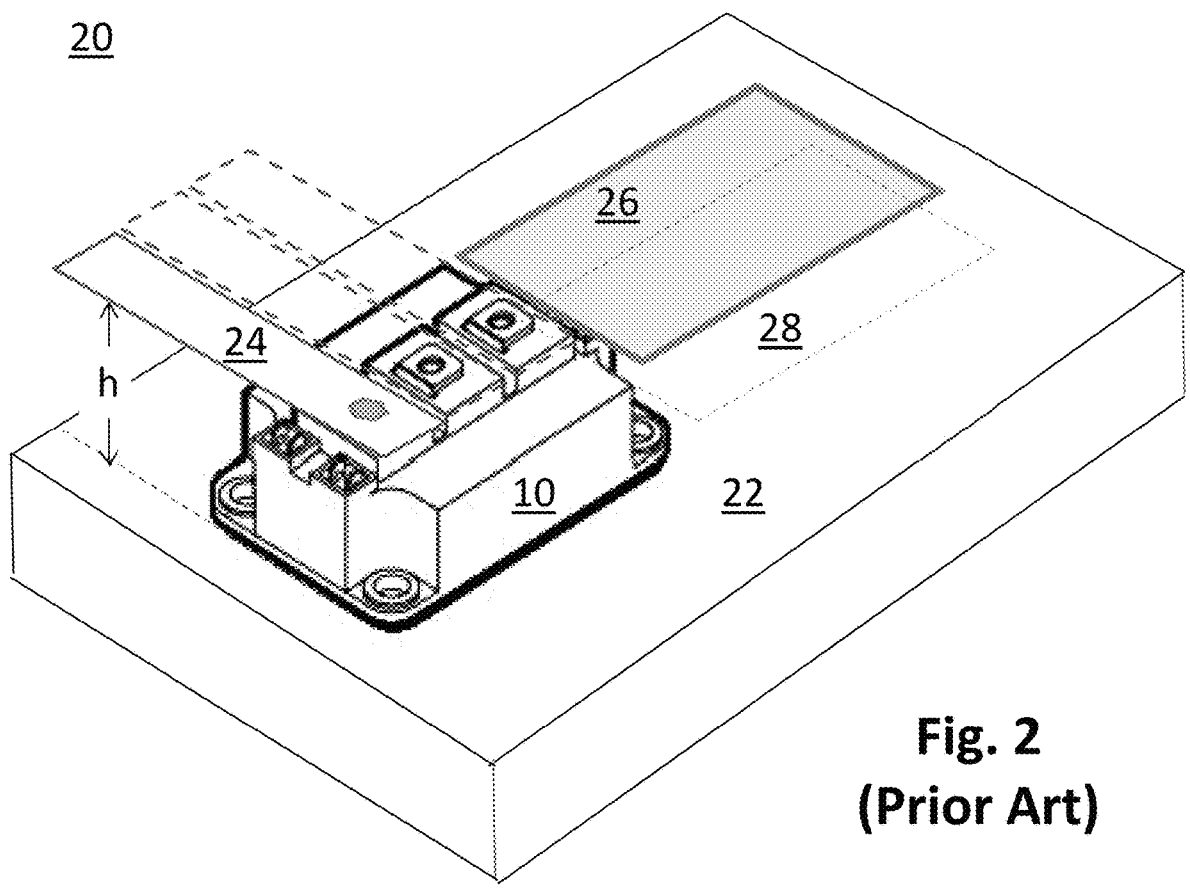
FIG. 2 (Prior Art) shows a schematic line drawing of an assembly comprising the power module of FIG. 1, mounted on a substrate, with a gate driver board connected to control terminals at one end of the module, and a busbar fastened to one of the power terminals.

A schematic line drawing of an example of an industry standard design of a housing-type power module 10 is shown in FIG. 1. The power module 10 has a housing comprising a baseplate 12 and a cover 14, which defines an exterior form of the power module comprising a block of generally rectangular form, e.g. what is referred to a "62 mm module" having dimensions of 62 mm×106 mm×30 mm. In this example, three power terminals 16 are arranged along the top of the module, and control terminal pins 18 are provided at one or both ends of the module. FIG. 2 shows a schematic line drawing of an assembly comprising the power module 10 of FIG. 1, mounted on a substrate 22, which comprises a cooling module, such as a heatsink or cold-plate with passive or active cooling. The substrate 22 of this type of housing module may be, for example, a DBC (Direct Bonded Copper) substrate, or other thermally conductive substrate that provides low thermal impedance. The assembly includes a power busbar 24 fastened to one of the power terminals and a gate driver board 26 connected to control terminals at one end of the module. The busbars 24 run over the top of the module and the driver board 26 is mounted to one side of the module 10, over area 28 of the substrate.

Figure 5:
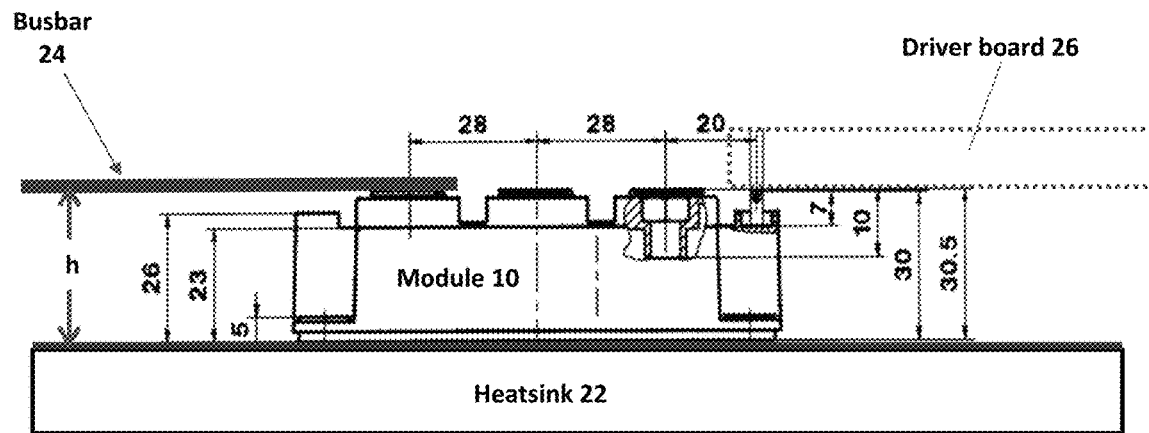
FIG. 5 (Prior art) shows a schematic side view of an assembly comprising a power module of the type shown in FIGS. 1 and 2, mounted on a substrate, and a busbar, to illustrate typical dimensions for standard clearance and creepage requirements.

As mentioned above, to meet creepage and clearance requirements for high voltage operation, modules of this type typically have a busbar-to-heatsink height of about 30 mm, i.e. the housing height h between the power terminals and the base of the module, as illustrated schematically in FIG. 2. For example, as illustrated schematically in more detail in FIG. 5, which shows some typical dimensions of a standard 62 mm module 10, the substrate-to-busbar height between substrate 22 and busbar 24 is ~30 mm, to meet standard creepage and clearance requirements, e.g. for 600V or 1200V operation. As illustrated schematically in FIG. 5, the driver board 26 is positioned laterally of the module connected to control pins at one end of the power module. In this type of module, the control terminals for connection to the gate driver board are positioned at one end of the module, and also extend to a height of ~30 mm from the base, so that the gate drive signal from the control terminal terminals is routed laterally from one end of the module. This arrangement results in a long signal path for the gate drive, which contributes to stray inductance in the gate drive loop, potentially limiting performance of ultra-fast wide-bandgap switching devices, such as GaN HEMTs.

Figure 3:
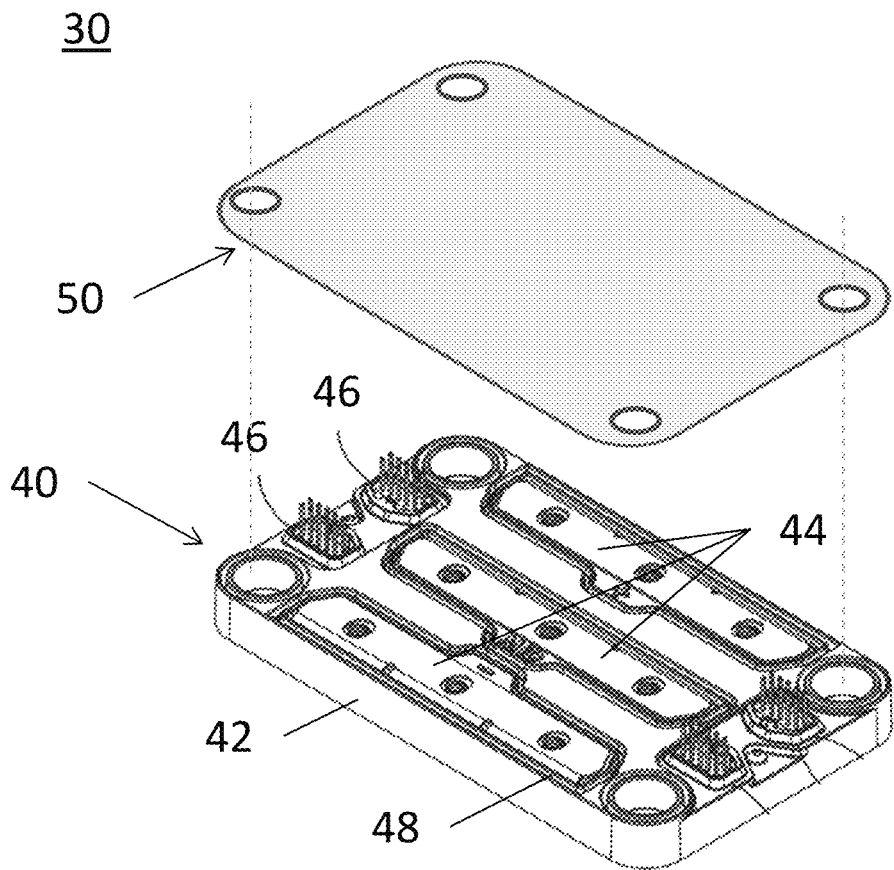
FIG. 3 (Prior Art) shows a schematic line drawing of an example of a low-profile power module and a gate driver board.
Figure 4:
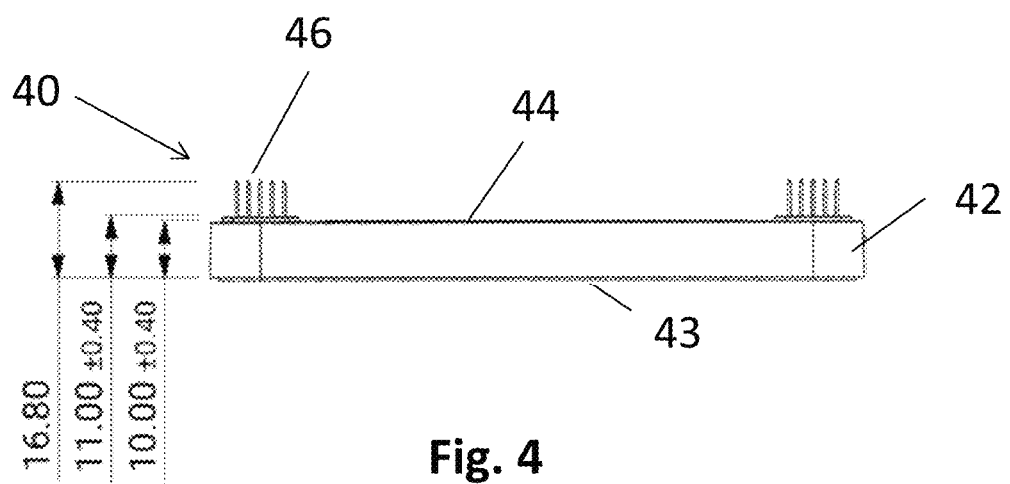
FIG. 4 (Prior art) shows a schematic line drawing of a side view of the power module shown in FIG. 3.
Figure 6:
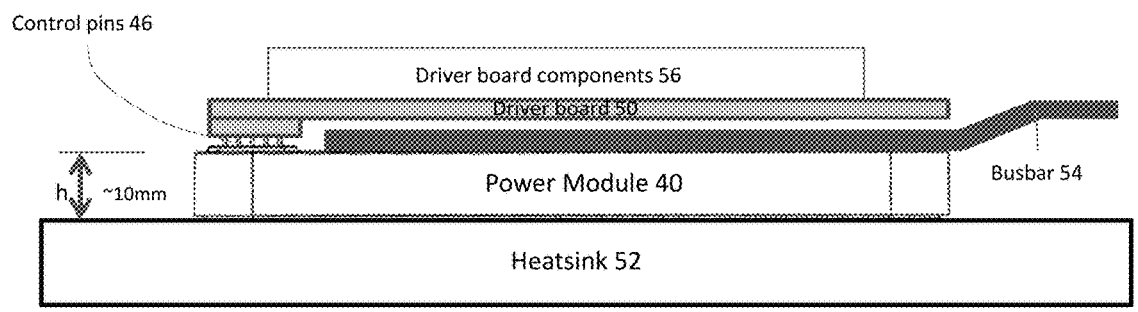
FIG. 6 (Prior art) shows a schematic side view of an assembly comprising a low-profile power module similar to that shown in FIGS. 3 and 4, mounted on a substrate, with a driver board and busbar.

A schematic line drawing of parts of an assembly 30 comprising an example of a low-profile power module 40 and a driver board 50 is shown in FIG. 3. The power module 40 has a low-profile housing 42, e.g., having a standard 62 mm footprint similar to that of the module 10 of FIG. 1. The power module 40 has three large area power terminals 44 arranged on the top of the module, and control terminal pins 46 at each end. The low-profile power contacts 44 are configured to reduce the stray inductance in the power loop, e.g. between the power terminals labelled + and − in FIG. 3. Since the height of the housing of the module 40 is ~10 mm, i.e. significantly lower than the 30 mm height of the conventional 62 mm module shown in FIG. 1, the housing 42 comprises creepage extenders 48 around each of the power terminals 44, and also around the control terminals 46. The driver board 50 has the same footprint as the underlying power module housing, with sockets for mounting on control terminals 46 of the module 40. FIG. 4 shows a schematic side view of the power module of FIG. 3 to illustrate typical dimensions, e.g. the housing 42 and the power terminals 44 have a height of about 10 mm, and the control terminals extend to a height of about 17 mm. As shown schematically in FIG. 6, the driver board 50, with driver board components 56, can be mounted directly over the module 40, e.g. as illustrated, overlying a power busbar 54 which is connected to one of the underlying power terminals of the module 40. This low profile design is configured to offer low stray inductance in the power loop, e.g. ~5 nH. However, as explained in the above referenced U.S. Pat. No. 9,426,883, the gate loop connections to the power switching devices are made from the control terminal pins 46 via an interconnection board carrying gate connections and kelvin source (source-sense) connections. The interconnection board is separate from and lies above the power substrate carrying the power buses and the switching devices, routing the gate drive signal laterally from the control terminal pins 46 which extend from the top of the module. This arrangement contributes to stray inductance in the gate drive loop, potentially limiting performance of ultra-fast wide-bandgap switching devices. For example, effects of parasitic inductances for a half-bridge power stage comprising two high-side and two low-side GaN HEMTs in parallel has been discussed in detail in the above-referenced article by J. Lu et al., entitled "A High Power-density and High Efficiency Insulated Metal Substrate Based GaN HEMT Power Module" (ECCE 2017), and references cited therein, and in a presentation by J. Lu et al. entitled "Parasitics Optimization for GaN HEMTs in Conventional Housing Type Power Modules", PCIM 2019, 4-9 May 2019. These references discuss the effects of commutation loop inductance, gate-drive loop inductance, mutual inductance between the power loop and gate loop, and quasi-common source inductance with respect to an insulated metal substrate (IMS) half-bridge power module; and these references are incorporated herein by reference in their entirety.

From these analyses, it is apparent that for conventional housing type power modules such as the example illustrated in FIGS. 1 and 2 (Prior Art), a housing having a housing height that meets the creepage and clearance requirements for high voltage operation results in high parasitic inductances of the gate drive loop and the power commutation loop. A low profile housing power module, such as the example illustrated in FIGS. 3 and 4, reduces parasitic inductance in the power loop, but may violate the creepage and clearance requirements for some power electronics systems.

Housing type power modules of some illustrative embodiments are now described, by way of example, in which the power terminals are provided having a first height to meet creepage and clearance requirements, and gate driver terminals and dynamic performance terminals, are low profile terminals of a second height, which is lower than the first height, to provide reduced parasitic inductances in the gate drive loop and in the power commutation loop.

Figure 7:
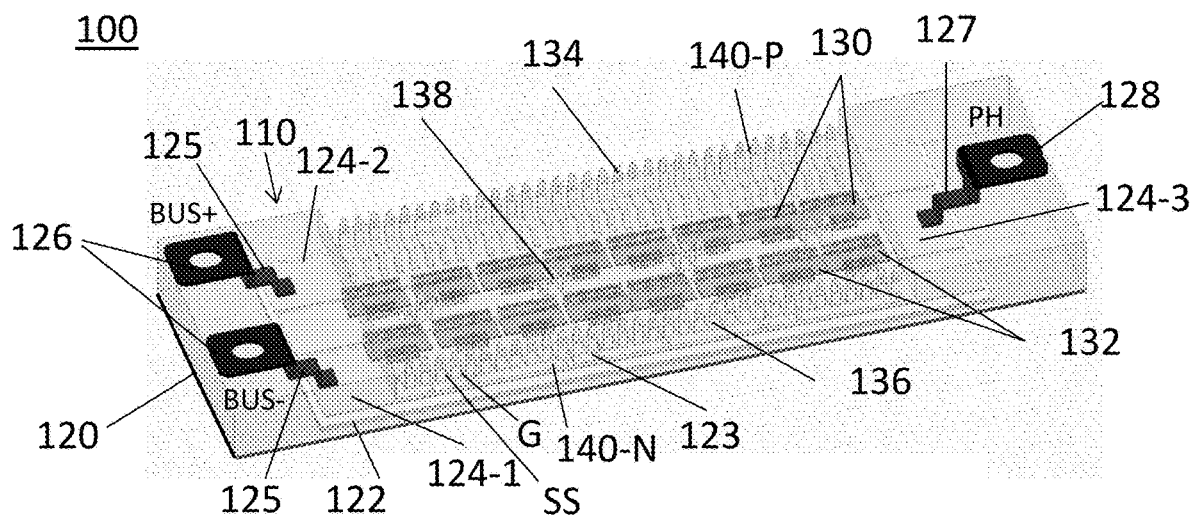
FIG. 7 shows a schematic diagram of a first view of a power module of a first embodiment, configured for a half-bridge GaN switch topology.

A schematic diagram of a first view of an assembly of parts of a power module 100 of a first embodiment, configured for a half-bridge GaN switch topology is shown in FIG. 7. A housing of the module 100 comprises a baseplate 120, defining a footprint of generally rectangular form, and a cover 110. The cover 110 is represented schematically as a semi-transparent element to show the inner components of the assembly. The baseplate 120 is a thermally conductive layer that supports a power substrate 122, e.g. a thermally conductive, electrically isolating, ceramic layer on which is defined a plurality conductive metal tracks defining power buses 124-1, 124-2 and 124-3 and a plurality of contact areas 123 for terminal members, i.e. pins or blades 134, 136 and 138. A plurality of GaN power switching devices 130 and 132 are mounted on the power substrate 122. The GaN power switches 130 are arranged in a first row comprising 8 high-side switch (HSS) positions of the half-bridge, and GaN power switches 132 are arranged in a second row comprising 8 low-side switch (LSS) positions of the half-bridge, and the 8 HSS and LSS are connected in parallel. The thermally conductive baseplate 120 provides mechanical support for the module and may comprises a single-layer or multi-layer structure, e.g. a thermally conductive metal substrate, such as copper, or a multi-layer thermally conductive metal-ceramic substrate, such as DBC, and typically has an arrangement of mounting holes (not shown in FIG. 7) for bolting the module to a substrate comprising a cooling module, e.g. a heatsink with passive or active cooling.

The conductive tracks of the power substrate define first and second power buses 124-1 and 124-2 extending lengthwise along first and second sides of the power substrate, adjacent the low-side and high-side power switching devices 130 and 1302. First and second power terminal members 125 are bonded to, and form an electrical connection with respective first and second power buses 124-1 and 124-2 at one end of the power substrate, and extend upwards through the cover 110 of the housing to external power terminals 126-1 and 126-2. The third power bus 124-3 extends between rows of high side and low side device positions to a third power terminal member 127. The third power terminal member 127 is bonded to, and forms an electrical connection with the third power bus 124-3, and extends through the cover 110 of the housing to external power terminal 128 at the other end of the power substrate. Conductive tracks of the power substrate also define an arrangement of contact areas 123 for first and second rows of terminals 134, 136, and terminals 138 in the middle. The first and second rows of terminals 134, 136 are arranged adjacent the first and second rows of high side and low side switching devices 130 and 132, and other terminals 138 are provided between the first and second rows of high-side and low-side switching devices 130, 132. These terminals include terminal members, e.g. in the form of pins, which provide gate G and source-sense SS connections for each of the high-side and low-side switching devices. Additional terminal members, that are referred to as "dynamic performance terminals" or "dynamic pins" 140-P and 140-N are also provided to each of the first and second power buses. The function of dynamic pins 140-P and 140-N will be described in detail with reference to FIGS. 14, 15A, 15B and 16. As illustrated schematically in FIG. 7, the terminal members or pins 134, 136, 138 are bonded to gate drive contact areas 123 for each switching device, and extend to a height of a few mm above the power substrate, below the height of the power terminals 126 and 128. The gate G and source-sense SS control terminals are located in close proximity, i.e. adjacent, to each switching device, and provide short, low inductance control terminal interconnections for the gate drive control loop for each switching device. The terminals may also include terminals for sensors such as a temperature sensor.

Switching devices comprising Si IGBTs and SiC MOSFETs may be provided as bare die. In contrast, GaN power switching devices are typically pre-packaged, e.g. each GaN E-HEMT die is embedded or encapsulated in a low inductance package, with source, drain and gate contact pads. The package may comprise, for example, GaN Systems Inc. GaNPx™ type of embedded packaging. For example, as illustrated schematically in FIG. 7, each packaged GaN device 130, 132 provides source, drain and gate contact areas on a top side of the package, and has a thermal pad on the other side, for attachment of the GaN package to the power substrate 122, in thermal contact with the power substrate. In this example, the source and drain contact pads of each package are interconnected to respective power buses by interconnects comprising multiple wirebonds. Gate connections G and source-sense connections SS to respective terminals are also provided by wirebonds.

Figure 8:
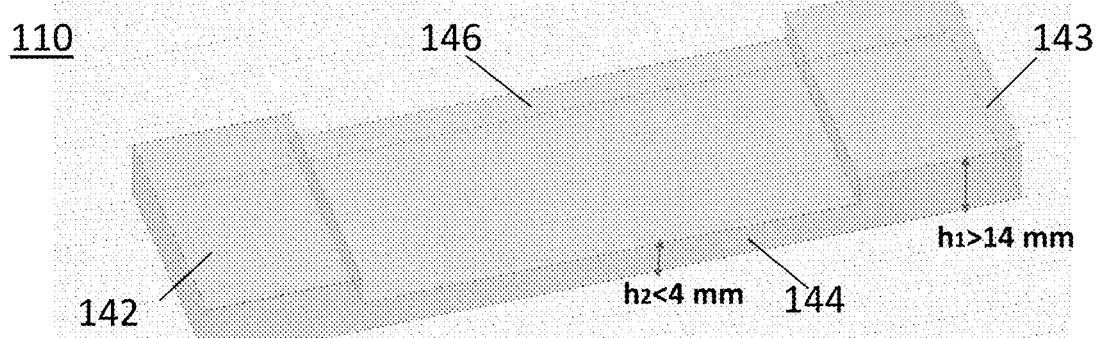
FIG. 8 shows a schematic diagram of a second view of the power module of the first embodiment, showing the exterior form of the housing.

The exterior form of the cover 110 of the housing is shown schematically in FIG. 8. The cover 110 has end portions 142 and 143 of a first height, e.g. >14 mm, and a lower-profile middle portion 144 of a second height, the second height being less than the first height, e.g. ≤4 mm, so that the middle portion forms a recess, or trough 146, for mounting thereon of a gate driver board.

Figure 9:
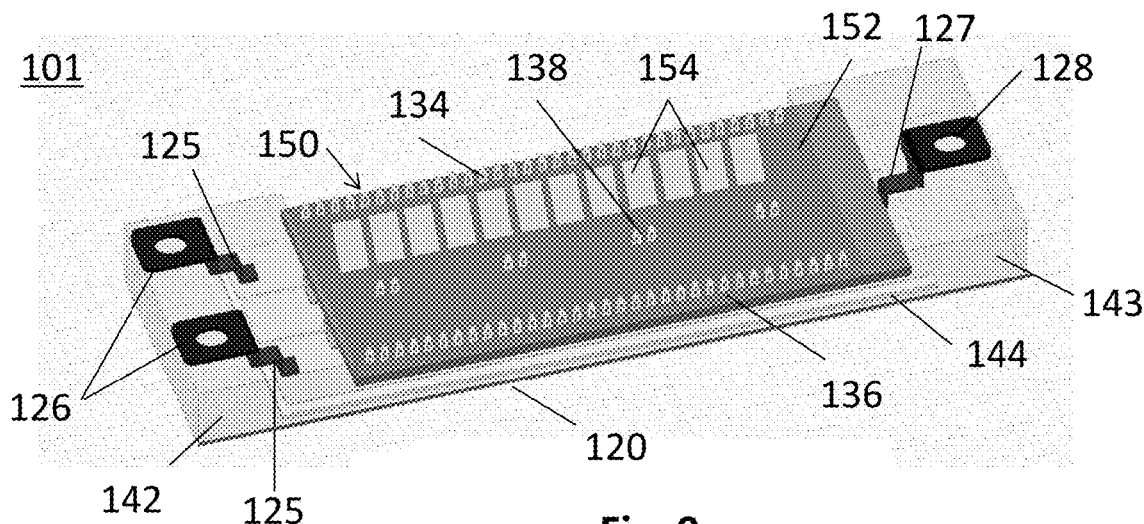
FIG. 9 shows a schematic diagram of a third view of an assembly of the power module of the first embodiment, with a gate driver board mounted on the housing.

As shown in the schematic view of the assembly 101 in FIG. 9, the first and second power terminal members 125 each extend from the respective power buses 124-1 and 124-2, through the cover of the housing to first and second external power terminals 126 on top of one end portion 142 of the housing; the third power terminal member 127 extends through the cover of the housing to a third external power terminal 128 on top of the opposite end 143 of the housing. The pins or blades of the rows of terminals 134 and 136 extend through the low-profile middle part 146 of the housing along each side of the housing for interconnection to corresponding connectors of the overlying driver board 150. The pins or blades of terminals 138 extend through a middle portion 144 of the cover for interconnection to corresponding connectors of the overlying driver board 150. Thus, as shown schematically in FIG. 9, control terminals 134, 136, 138 extend through the surface 152 of the driver board and decoupling capacitors 154 are mounted on the surface 152 of the driver board 150.

Figure 10:
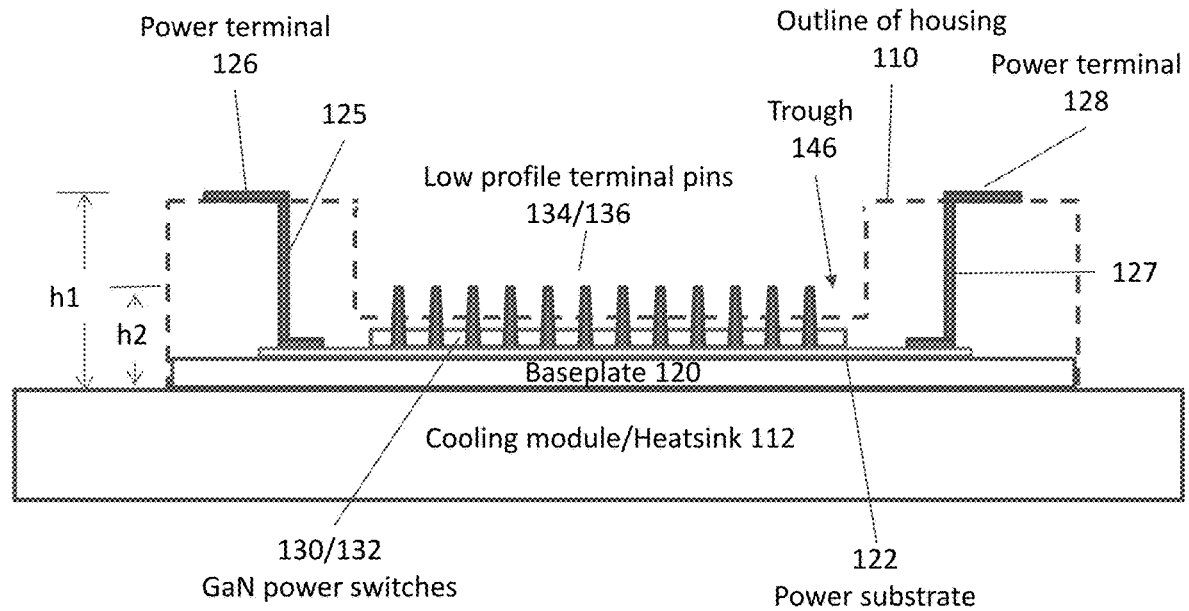
FIG. 10 shows a schematic side view of an assembly comprising the power module of the first embodiment with the cover of the housing shown in dotted outline.

FIG. 10 shows a schematic side view 100-1 of an assembly comprising the power module of the first embodiment, with the outline of the cover 110 of the housing shown by a dashed line. The baseplate 120 of the power module 100 is thermally conductive and is mounted in thermal contact with the substrate 112, which comprises a heatsink. The power substrate 122 is in thermal contact with the baseplate 120, and power terminal members 125 and 127 extend upwards from conductive tracks defining power buses on the power substrate 122 to external terminals 126 and 128 on top of the housing cover 110, at a height $h_1$. The terminal members or pins 134 and 136 extend through the low-profile part 146 of the housing, that forms a recess or trough in the top of the cover 110. The terminal pins 134 and 136 extend to a height $h_2$, which is less than $h_1$. The position of the plurality of GaN power switches 130 and 132 on the power substrate 122 is also indicated schematically. Since the GaN power switches are encapsulated (whereas Si IGBTs and SiC MOSFETS are usually provided as bare die) the clearance between the power substrate 122 and the cover 110 of the housing in the region of the trough 146, provides a space for mounting of the encapsulated GaN devices, and for wirebonded connections of the source, drain and gate pads of the encapsulated GaN devices, as appropriate, to power buses and contact areas for the control terminals. For example, this clearance is several mm, and the low profile part of the housing may be e.g. 4 mm or less in height. The configuration and height $h_2$ of terminal pins G and SS for the gate and source-sense connections are selected to provide short, low-profile terminals which reduce the stray inductance in the gate drive loop e.g. $h_2$ is ~5 mm, and preferably less than 10 mm. The height $h_1$ of the power terminals 126 and 128 is selected to provide a heatsink-to-busbar distance that meets required creepage and clearance requirements, e.g. for an operational voltage of >600V.

Figure 11:
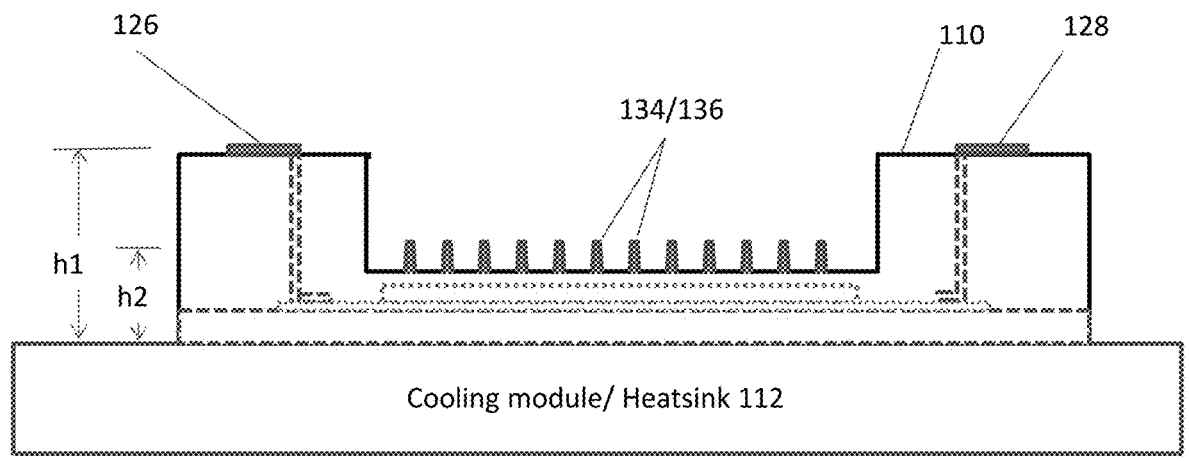
FIG. 11 shows a schematic side view an assembly comprising the power module of the first embodiment with the cover of the housing in place.

FIG. 11 shows a schematic side view 100-2 of the assembly of FIG. 10, comprising the power module of the first embodiment with the cover 110 of the housing in place, showing external power terminals 126 and 128 on the exterior of the cover 110 at height $h_2$ and low-profile terminal members 134, 136 and 138 extending through the cover of the housing at height $h_2$, within the trough or recess created by the low-profile part of the cover 110.

Figure 12:
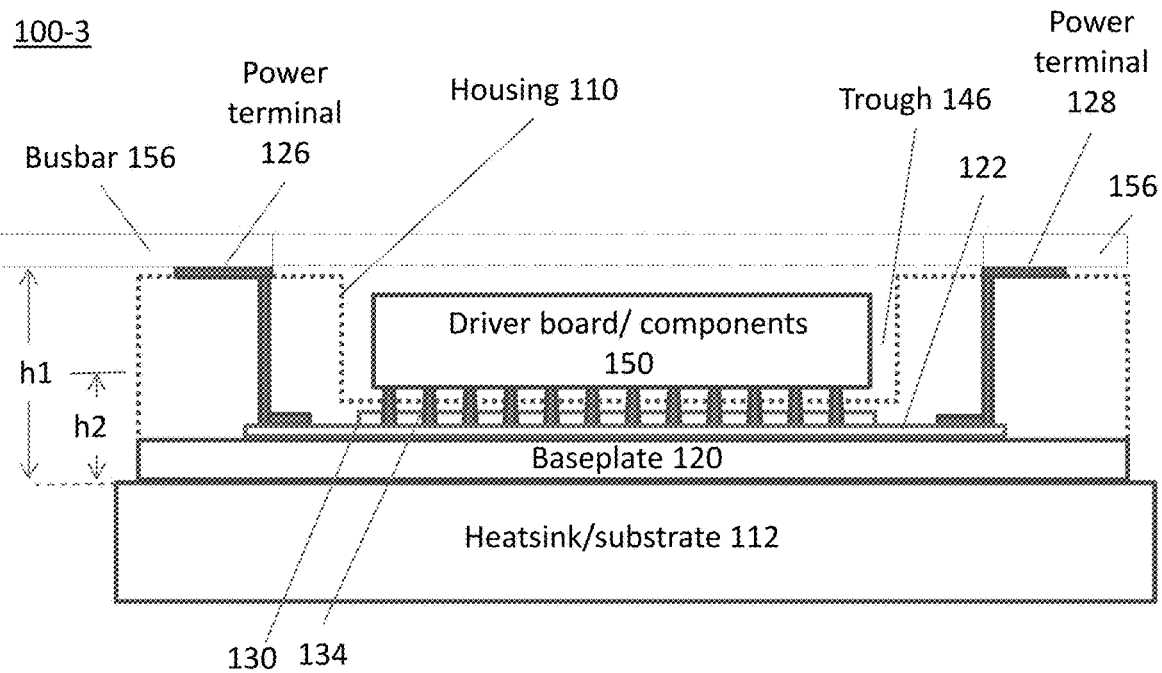
FIG. 12 shows a schematic side view of an assembly comprising the power module of the FIG. 10, with a gate driver board and a busbar, with the outline of the cover of the housing indicated by a dashed line.

FIG. 12 shows a schematic view 100-3 of an assembly comprising the power module of FIG. 10, with the outline of the cover 110 of the housing indicated by a dashed line. The assembly comprises baseplate 120, power substrate 122, GaN switching devices 130, power terminal members 125 and 127 extending through the cover 110 of the housing to external power terminals 126 and 128 at height $h_1$, and terminals 134 extending through the cover 110 at height $h_2$. A gate driver board 150 is mounted on control terminals 134, within the trough 146 on top of the housing cover 110. Also shown is positioning of busbars 156 overlying the gate driver board 150, for connection to the external power terminals 126 and 128. To accommodate decoupling capacitors 154 on the driver board 150, below height $h_1$, low-profile ceramic capacitors may be preferred. If the driver board and its components extend above the height of the power terminals, the busbar 156 may be routed accordingly, e.g. above or around the driver board and its components.

Figure 13:
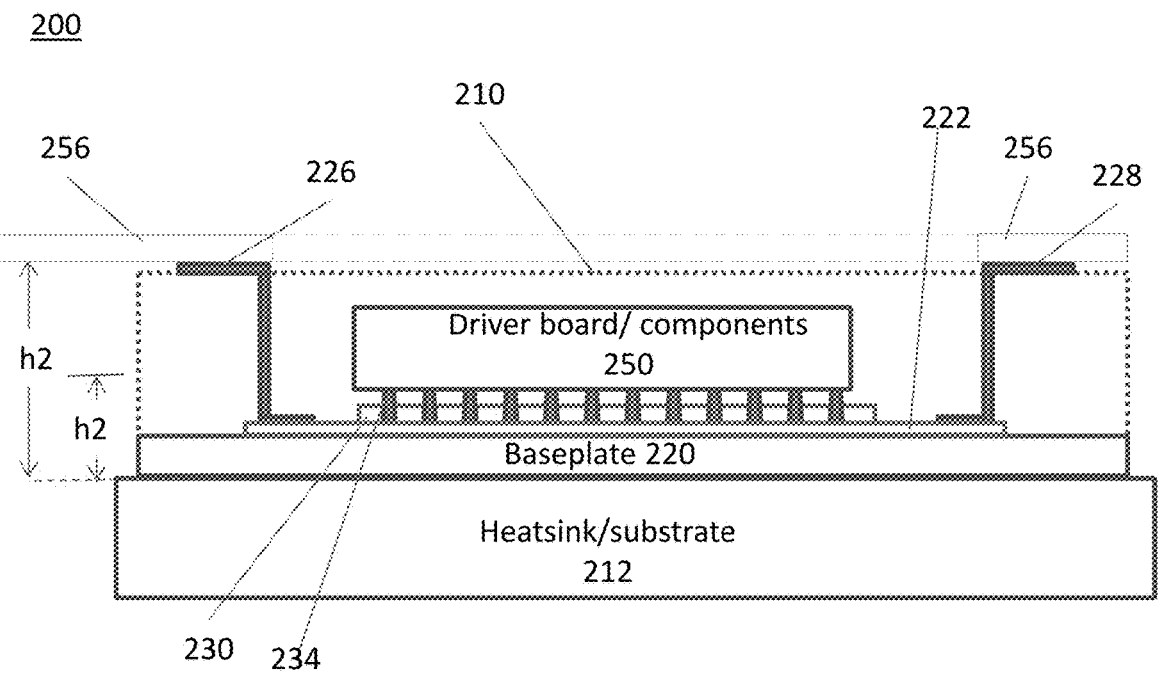
FIG. 13 shows a schematic side view of an assembly comprising a power module of a second embodiment, with a gate driver board and a busbar, with the outline of the cover indicated by a dashed line.

The schematic view in FIG. 13 shows an assembly 200 comprising components of a power module of a second embodiment, comprising a baseplate 220, power substrate 222, power terminals 225 and 227 extending through the cover 210 of the housing to external power terminals 226 and 228 on top of the housing at height $h_1$, and low profile control terminals 234 extending to height $h_2$, all of which are similar to those shown in FIG. 12, except that, in the assembly of this embodiment, the driver board 250, with its components, is contained within the cover 210 of the housing, underlying the busbar 256.

FIG. 14 shows a schematic plan view of the substrate 122 showing the layout of components of the power module of the first embodiment, which is illustrated schematically in FIGS. 7 to 9. There are a plurality of GaN HEMT switching devices, comprising HSS 130 and LSS 132. interconnected in parallel in a half-bridge configuration. As mentioned above, to reduce the gate loop inductance for each HSS and LSS, low profile terminal pins for source sense SS and gate G connections are placed in close proximity to each GaN HEMT, i.e. terminals 136SS and 136G for the LSS and 138SS and 136G for the HSS. The first row of terminal pins 134 comprises multiple additional pin 140-P arranged along the V+ power bus 124-2. The second row of terminal pins 136 comprises multiple additional pins 140-N arranged along the V− power bus 124-1. The additional pins 140-P and 140-N are configured to provide a low inductance, and low resistance, signal path for high di/dt transients for each of the HSS and LSS switches which are connected in parallel, and will be referred to as dynamic performance pins or "dynamic pins". Thus, as illustrated schematically in FIG. 15A, as annotated by red dotted arrows, the dynamic pins provide a more balanced power commutation loop inductance for each of the HSS and LSS switches which are connected in parallel. As illustrated schematically in FIG. 15B, in a module of a third embodiment, when the dynamic pins are omitted, although this topology provides low inductance SS and G terminal pins in close proximity to each GaN switching device for reduced gate loop inductance for each HSS/LSS switch, without the dynamic pins, there are unbalanced power commutation loop inductances for each parallel connected HSS/LSS.

Figure 16:
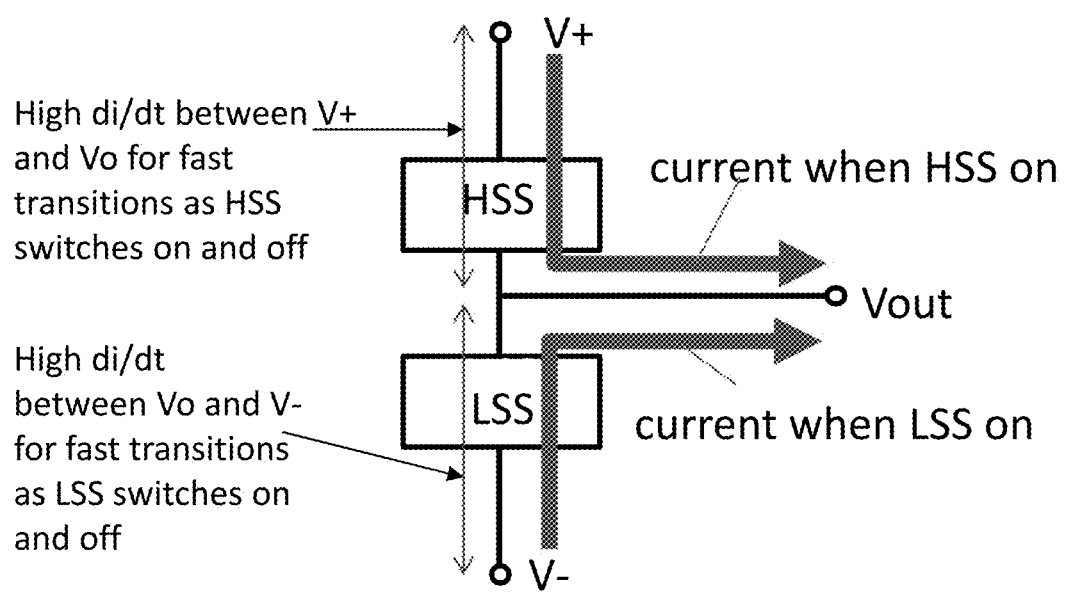
FIG. 16 is a schematic diagram to illustrate current switching transients di/dt in a half-bridge circuit using fast GaN switching devices for HSS and LLS.

FIG. 16 is a schematic diagram to illustrate current switching transients di/dt in a half-bridge circuit using fast GaN switching devices for HSS and LLS. When either the HSS or LLS is on, current will flow through the respective power buses, as indicated by thick blue arrows. Since GaN HEMTs have turn-on and turn-off times of a few ns, during turn-on and turn-off, each switch will experience high di/dt transients, as indicated schematically in red in FIG. 16. When there are multiple GaN switches connected in parallel, each has a power commutation loop inductance, which may differ based on layout, e.g. as shown in FIGS. 15A and 15B. An arrangement of multiple dynamic pins for each HSS/LSS GaN switch provides a low inductance path, as illustrated schematically in FIG. 15A, between each power bus and the driver board, which balances, or at least reduces imbalances, in the inductance of each power commutation loop, for dissipation of high di/dt transients, to provide improved performance, e.g. reduce oscillations and instabilities.

Thus, a power module comprising a GaN HEMT half bridge topology comprising a plurality of parallel connected GaN HSS/LSS switches, of the embodiment illustrated schematically in FIGS. 7 to 14, and FIGS. 15A and 15B, provides two solutions to address parasitics and improve performance of housing-type power modules for wide-bandgap semiconductor switches. Firstly, the physical design of the power module provides a housing with a low-profile central portion with low inductance terminals for mounting of the driver board, and end portions provide power terminals at a height that meets creepage and clearance requirements. The low profile portion may be a recess or trough which accepts the driver board. This allows for low-profile, i.e. shorter, lower inductance, lower resistance control terminal members, e.g. source-sense SS and gate G pin in close proximity to each GaN switch, to reduce the gate loop inductance, i.e. for low stray inductance of a gate drive loop for each GaN power switching element. Secondly, provision of rows of multiple dynamic pins arranged to connect the power buses to the driver board provides a low inductance path for high di/dt switching transients to balance the inductance of power commutation loops for each of the paralleled GaN power switching elements.

Figure 17:
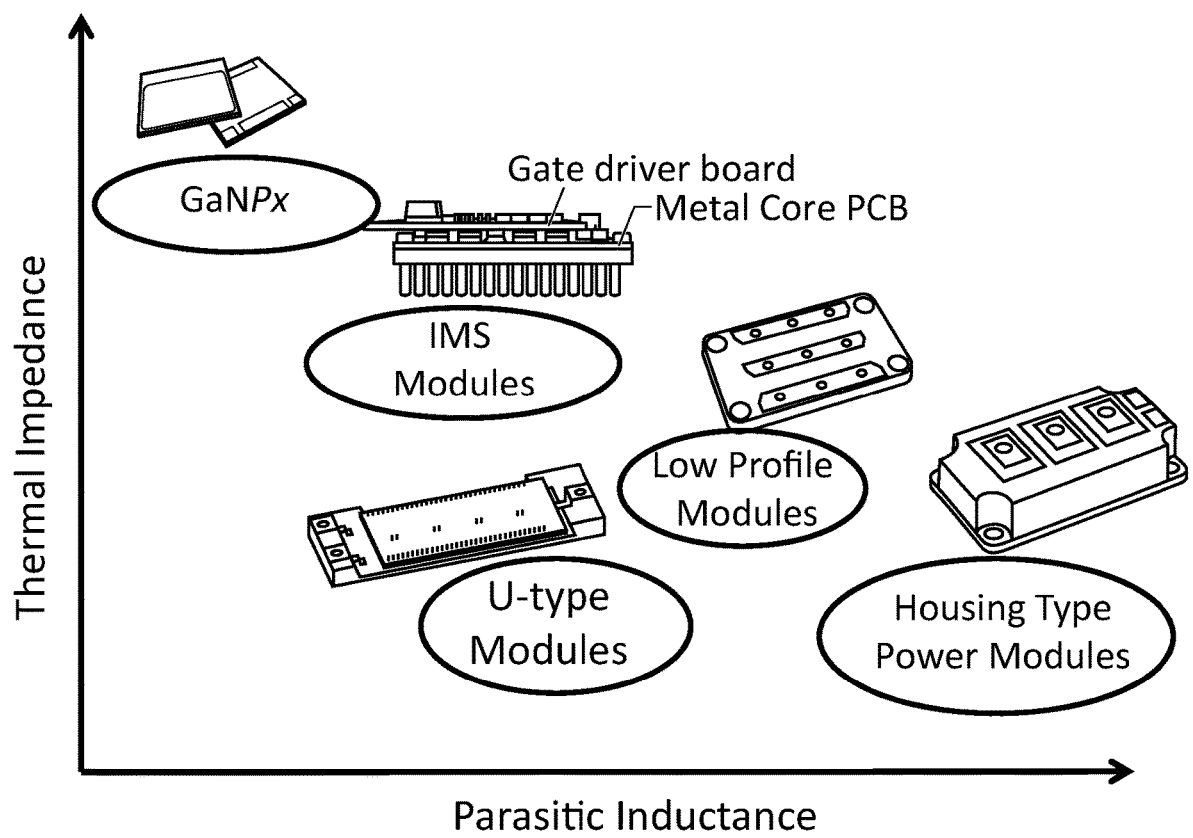
FIG. 17 shows a graphical plot comparing the thermal impedance and parasitic inductance of power modules of various types.

A graphical comparison of the performance of various types of power modules is illustrated schematically in FIG. 17. This plot shows the parasitic inductance vs. thermal impedance for four conventional types of power modules and a power module of the first embodiment, which is referred to as a U-type module. A GaN power switch in a GaNPx type embedded package provides very low parasitic inductance, but has a higher thermal impedance, and is e.g. suitable for power applications, such as ≤1 kW. Insulated Metal Substrate (IMS) modules can provide excellent thermal performance for high power applications, e.g. up to 30 kW, with low parasitic inductance, at reasonable cost. Low profile modules, such as illustrated by the example shown in FIGS. 3 and 4, provide reduced power loop inductance, but may not meet standard creepage and clearance requirements for high voltage operation. Housing type power modules, e.g. as illustrated by the example shown in FIGS. 1 and 2, have low thermal impedance, i.e. superior heat dissipation for high power applications, but have high parasitic inductances, which limits performance of fast GaN switching devices. A U-type module, for example, as illustrated by the module first embodiment described above, provides a housing module design with reduced parasitics, i.e. reduced gate loop inductance and reduced and more balanced power commutation loop inductances, for improved performance, and low thermal impedance.

Figure 18:
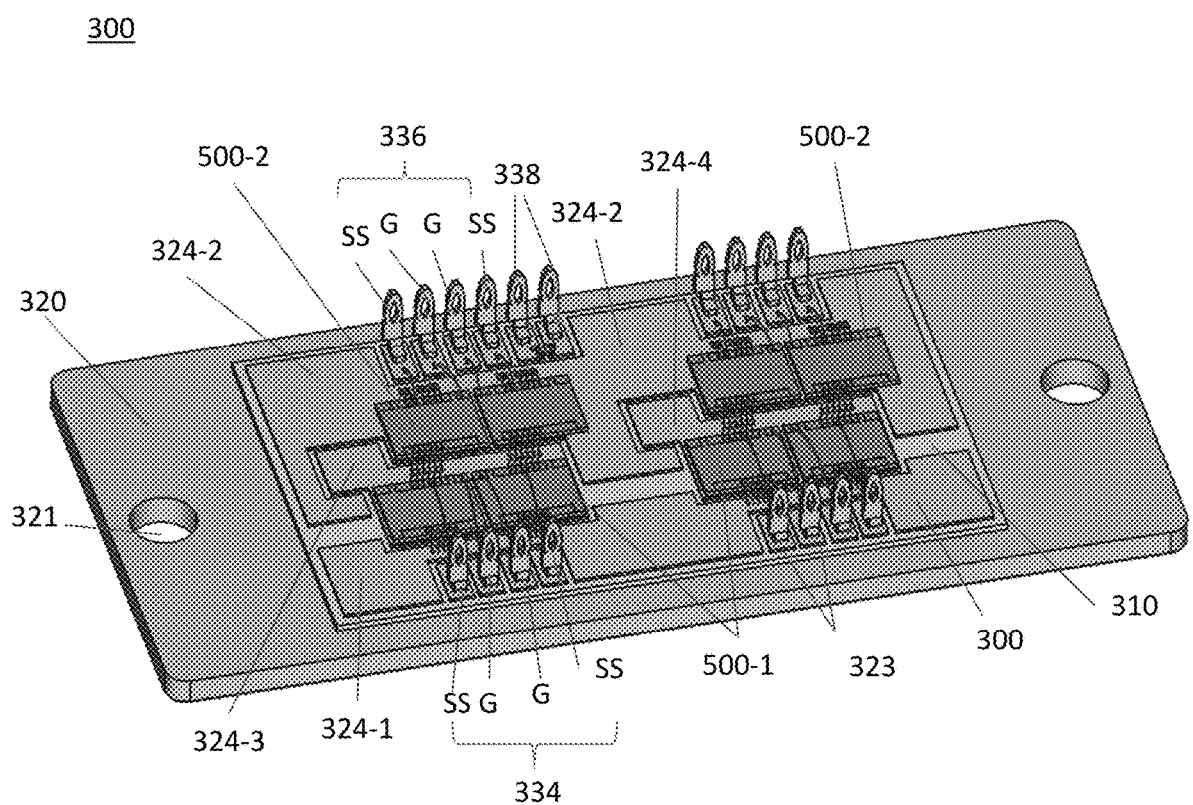
FIG. 18 shows a schematic diagram of an interior view of parts of a power module of a fourth embodiment, configured for a full-bridge GaN switch topology.

FIG. 18 shows a schematic diagram of an interior view of an assembly 300 of components of a power module of a fourth embodiment, configured for a full-bridge GaN switch topology. The assembly 300 comprises a thermally conductive baseplate 320 having bolt holes 321 for mounting to an underlying cold plate or heatsink. For example, the baseplate comprises a thermally conductive metal layer or a thermally conductive metal-ceramic multilayer substrate. A power substrate 310 is provided on the baseplate 320. The power substrate comprises e.g. a ceramic substrate and a metal layer defining conductive metal tracks for power buses 324-1, 324-2, 324-3 and 324-3 and contact areas 323 for rows of terminals 334, 336 and 338. The baseplate 320 and power substrate 310 may be separate elements, or they may be provided by layers of a multilayer substrate, such as a direct bond copper (DBC) substrate. Device areas of the power substrate are arranged for attachment of encapsulated GaN power switching devices 500 arranged in two rows, i.e. a first row of high side switches 500-1 and a second row of low-side switches 500-2. Each switch position comprises two GaN E-HEMTS connected in parallel. The GaN E-HEMTs are packaged, e.g. encapsulated in packaging comprising low inductance interconnections to source, drain and gate contact areas on a top side of the package as illustrated schematically, and a thermal pad on the underside of the package. The power buses 324-1, 324-2, 324-3 and 324-4 extend between the rows of GaN power switching devices, with areas for attachment of power terminal members. Terminal members 334 and 336, i.e. gate terminals G and source-sense terminals S for each GaN switching device are arranged as rows extending lengthwise along each side of the power substrate 322, and extend directly from control contact areas 323 placed in close proximity to the respective GaN device that they control. The low-profile terminals 334 and 336 for the gate G and source-sense SS connections for each device are bonded to and electrically connected to the control contact areas 323 to provide a short low inductance gate drive control connection. The control terminals may comprise additional terminal members 338 for other elements, e.g. for a temperature sensor.

Figure 19:
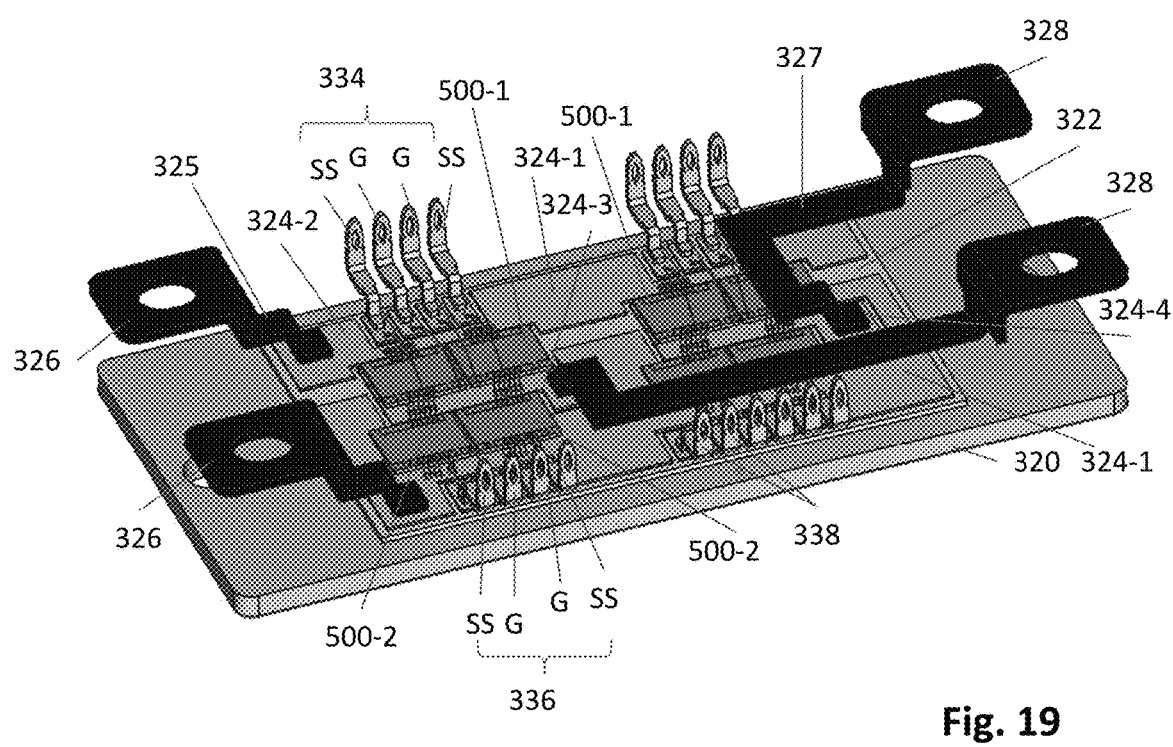
FIG. 19 shows another schematic diagram of an interior view of part of the power module of the fourth embodiment, configured for a full-bridge GaN switch topology, showing the power terminals extending from the power buses.

FIG. 19 shows another (rotated) schematic diagram of an interior view of the assembly of parts the power module of the fourth embodiment shown in FIG. 14, and further comprising power terminal members 325 and 327 bonded and electrically connected to each of the power busses 324-1, 324-2, 324-3 and 324-4. The power terminal members 325 and 327 extend upwardly from the power busses to external power terminals 326 and 328 at a first height $h_1$ above the baseplate, to meet required creepage and clearance specifications, such as a minimum substrate-to-busbar height. The control terminals 334 and 336 extend to a second height $h_2$, less than $h_1$, to provide low-profile, low inductance control terminals for the gate drive connections.

Figure 20:
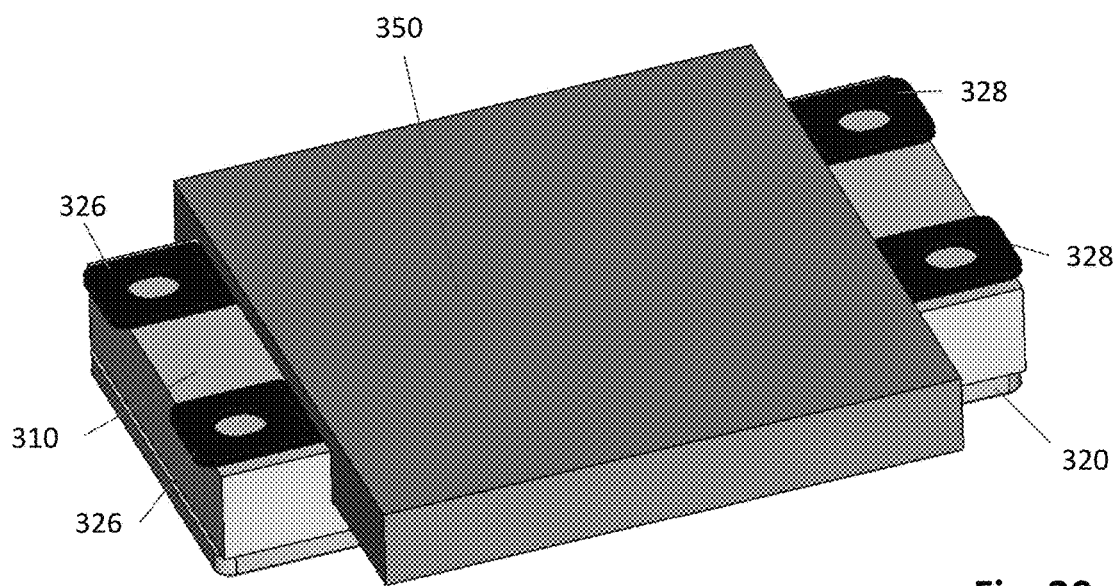
FIG. 20 shows a schematic diagram of an assembly of the power module of the fourth embodiment with a driver board mounted on the cover of the power module.

FIG. 20 shows a schematic diagram of an assembly of the power module of the fourth embodiment, with the cover 310 of the housing in place and with a driver board 350 mounted on the control terminals in the recess of the cover 310 of the power module 300. This arrangement with direct connection of the gate driver board to the low-profile control terminals provides for a shorter gate drive loop, to provide reduced stray inductance in the gate loop circuit compared to conventional power modules. By way of example, the height of the housing in the recess may be 4 mm or less, and the control terminal members extend directly from the control contact areas adjacent each GaN device, through the cover in the recess to ends of the terminals at height $h_2$, which may be e.g. ~5 mm. Thus, the configuration of the low-profile gate drive terminals of the embodiment shown in FIG. 15 significantly reduces stray inductance in the gate drive loop compared to conventional forms of power modules. For example, for the prior art module shown in FIG. 1 the control pins extend 30 mm above the base. For the low-profile module shown in FIG. 3, the control pins extend, above the power terminals, to 17 mm and the arrangement of the control pins at one end of the module results in a longer signal path for the gate drive loop, through a gate and source board, which adds parasitic inductance in the gate drive circuit.

Reduced stray inductance in the gate loop provides improved performance for operation at higher switching frequencies, and particularly for operation with ultra-fast switching devices, such as GaN E-HEMTs, in which turn-on and turn-off times for switching transitions are only a few ns, e.g. in the range from 1 ns to 10 ns, and which can operate at higher switching frequencies, e.g. at switching frequencies in the range from >10 kHz to 2 MHz. For example, while not wishing to be limited to a specific values of stray inductance, for high di/dt switching it may be desirable to reduce the parasitic inductance of the gate drive loop by 10 nH or 20 nH relative to currently available power modules, for example, to provide a stray inductance of the gate loop in a range such as <30 nH, <20 nH, <10 nH or more preferably <5 nH.

For example, simulations may show that it is required to reduce the gate drive loop inductance to ≤10 nH to avoid false-triggering or oscillation. For a power module of the embodiment shown in FIGS. 7 to 12 and 14, based finite element modeling simulation, with the proposed housing and terminal configuration, the gate driver loop inductance can be controlled to be <5 nH, and power commutation loop inductance can be reduced to ~2 nH. The presence of two rows of dynamic performance terminals provides a more symmetric arrangement and reduces the quasi-common source inductance to ~0.3 nH (J. Lu et al. "Parasitics Optimization for GaN HEMTs in Conventional Housing Type Power Modules", PCIM 2019, 4-9 May 2019).

In variants of the assembly of the power module of the embodiment shown in FIG. 20, the gate driver board may be configured to fit within the footprint of the baseplate, below height $h_1$ of the power terminals (e.g. similar to the arrangement shown in FIG. 12), and/or the cover and gate driver board may be configured so that the gate driver board is mounted within the cover of the housing (e.g. similar to the configuration shown in FIG. 13).

Figure 21A:
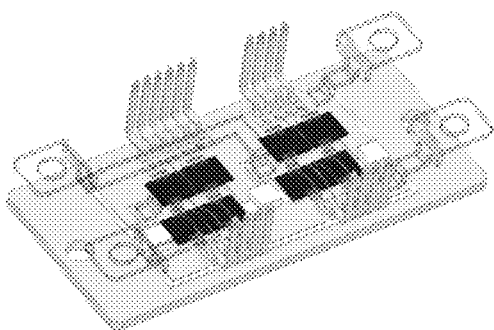
FIG. 21A shows a schematic diagram of an interior view of parts of a prior art power module, configured for a full-bridge GaN switch topology
Figure 21B:
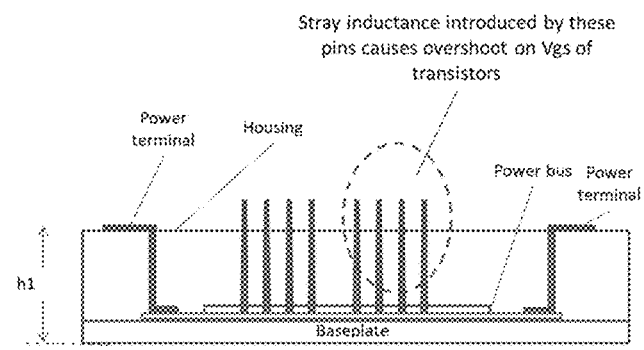
FIG. 21B shows a cross sectional view.
Figure 21C:
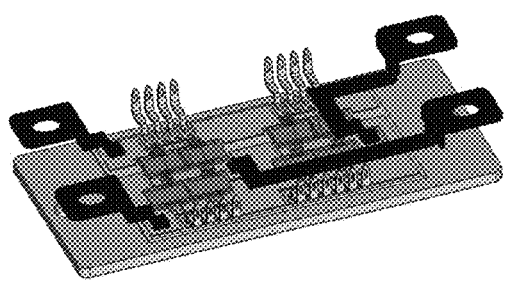
FIG. 21C shows a schematic diagram of an interior view of parts of the power module of the fourth embodiment, configured for a full-bridge GaN switch topology, as shown in FIG. 19.
Figure 21D:
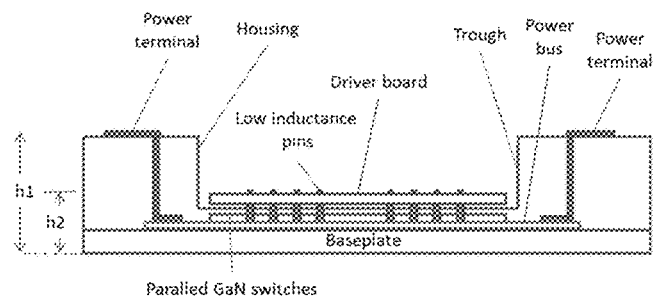
FIG. 21D shows a cross sectional view.

FIG. 21C shows a schematic diagram of an interior view of parts of the power module of the fourth embodiment, i.e. as shown in FIG. 19, configured for a full-bridge GaN switch topology and FIG. 21D shows a schematic cross-sectional view. For comparison, FIG. 21A shows a schematic diagram of an interior view of parts of a prior art power module, configured for a full-bridge GaN switch topology and FIG. 21B shows a schematic cross-sectional view.

Figure 22A:
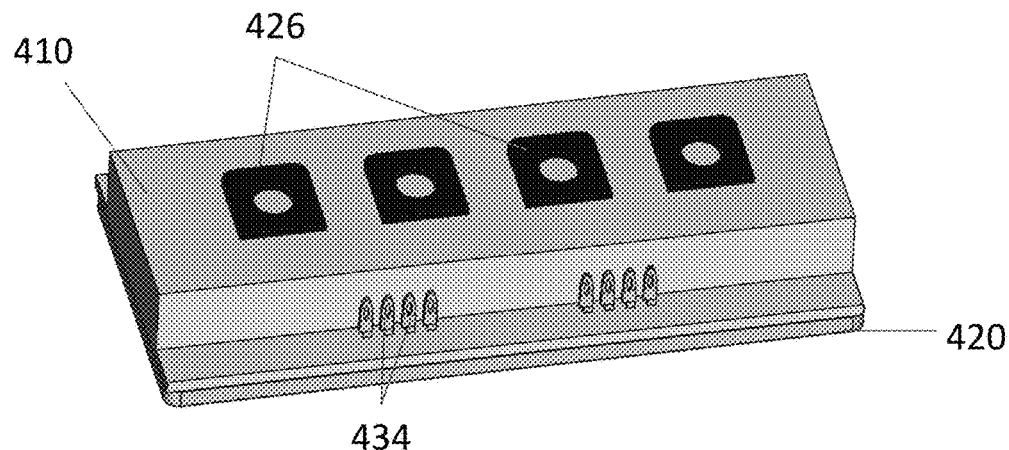
FIG. 22A shows a schematic diagram of a view of a power module of a fifth embodiment.
Figure 22B:
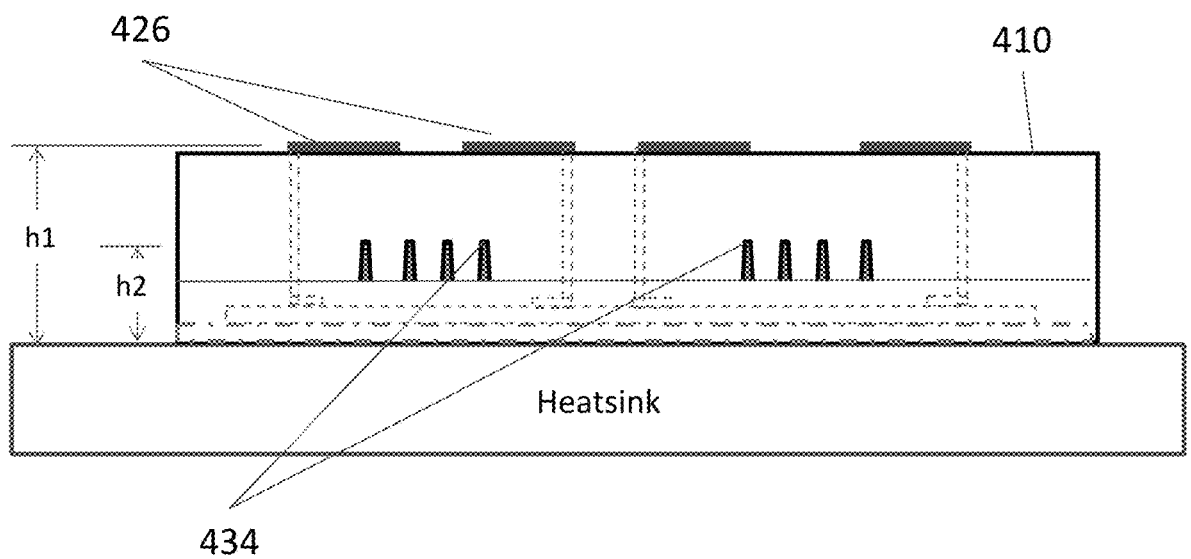
FIG. 22B shows a schematic cross-sectional view of an assembly comprising the power module of the fifth embodiment.

FIG. 22A shows a schematic diagram of a view of a power module 400 of a fifth embodiment, wherein the housing 401 comprises a baseplate 420 and cover 410, in which four power terminals 426 are arranged along a top of the cover 410 of the module, and a row of control terminals 434 extend through a low-profile part 411 of the cover 410, for mounting of a driver board thereon, i.e. extending laterally of the cover 410 of housing. FIG. 22B shows a schematic side view of the power module 400 of the fifth embodiment showing the power terminals 426 extending through the top of the housing cover 410 at height $h_1$ and the low profile control terminals 434 at height $h_2$. This alternative configuration provides for height $h_1$ of the power terminals to be selected to meet creepage and clearance requirements, and for height $h_2$ to provide low profile control terminals for lower inductance in the gate drive circuit, for mounting of the gate driver board on the control terminals, with the gate driver board extending laterally of the housing.

Advantageously, power modules in which power terminals extend through each end of the cover of the housing to height $h_1$, and a middle portion of the cover of the housing is recessed, e.g. to form a trough, enables mounting of the gate driver board on top of the lower profile part of the housing, for example as illustrated schematically in FIG. 12, with the gate driver board interconnected to the underlying control terminals. Alternatively, the gate driver board can be connected to the control terminals within the housing, for example, as illustrated schematically in FIG. 13.

Referring back to FIG. 19, the interconnections of the power module for the gate and source-sense for each power switching device 500-1 and 500-2 are configured to reduce the inductance in the gate control loop, e.g. the low profile control terminals are low inductance terminal members located in close proximity, i.e. adjacent each switching device, to provide a short interconnect distance to the gate driver control board which is mounted directly on the control terminals. This arrangement of low-profile, short low inductance gate and source-sense connections for each switching device reduces the stray inductance of the gate loop circuit compared to conventional power module designs. This configuration also provides for separation of high frequency di/dt signal paths of the gate drive loop, and lower frequency signal paths between the power terminals of the power loop. This separation of the high frequency signal paths in the low inductance gate driver control loop from lower frequency signals of the low inductance power loop, reduces interference. Also, for example, this arrangement allows for DC terminals on one end of the power module and AC terminals on the other end of the power module. This design configuration overcomes disadvantages of known power module designs that have long gate control connections extending lengthwise between the control terminals on the power substrate, e.g. routed through conductive tracks on a separate gate connection board, to external connections to the gate driver board.

Although not illustrated in FIGS. 18 to 20, where multiple GaN HEMT switching devices are connected in parallel in a full bridge configuration, each HSS/LLS switch may be provided with a plurality of dynamic pins, e.g. as described above with reference to the GaN HEMT half bridge of the first embodiment, for connection to the driver board, to provide a low inductance path for high di/dt transients. That is, in FIGS. 18 and 19, the rows of terminal pins 334 and 336 include only the terminal pins for SS and G connections. The rows of terminal pins 334 and 336 may be extended to provide a plurality of dynamic pins to the power buses, adjacent each switching device, similar to the dynamic pins 140 of the power module of the first embodiment shown in FIGS. 7, 9, 14 and 15A.

In conventional power modules, decoupling capacitors are provided internally in the power module, but this means they are closer to the heat source. For improved reliability, the decoupling capacitors are provided on the driver board, e.g. as shown schematically in FIG. 9.

In the structures of the embodiments described above, the baseplate and power substrate are described as separate layers or elements, but they may be integrated, e.g. comprise layers of a multi-layer substrate, comprising thermally conductive and electrically insulating layers and electrically conductive layers. For example, the baseplate and power substrate may comprise a DBC (Direct Bond Copper) substrate. For example, a DBC substrate may comprise a thick copper baseplate, an electrically insulating layer of a thermally conductive ceramic, such as alumina or aluminum nitride, and an electrically conductive layer of copper providing the conductive metal layer defining power buses and control contact areas of the power substrate. The baseplate has a high thermal conductivity and is ideally CTE matched to layers of the power substrate. Power modules of embodiments that are disclosed herein are configured for high-current, high-speed power switching devices, such as GaN HEMTs. In some embodiments, the housing has a low-profile middle portion providing a trough for mounting thereon of a driver board. Power contacts are provided on end portions of the housing, which have a height greater than the middle portion, to provide a heatsink-to-busbar distance which meets conventional/standard creepage and clearance requirements, e.g. for 300V to 400V operation, such as 380V for industrial motors and 400V for electric vehicles, or for other applications requiring higher voltage operation, e.g. >600V or ≥1200 Low profile control terminals for gate and source-sense connections comprise rows of short pins or blades extending along each side of the low-profile middle portion of the housing, from control contact areas in close proximity, i.e. adjacent to, each of the power switching devices. Additional low profile dynamic performance pins are arranged along the length of each side of the low-profile middle portion of the housing to provide distributed low inductance pathways, for high di/dt switching transients in power commutation loop, between the power buses and the driver board, thus balancing, or at least reducing imbalances, in the inductances of the power commutation loops for multiple parallel connected GaN LSS/HSS switching devices, e.g. for improved dynamic performance. The gate driver board is mounted on the low profile pins, i.e. the gate and source sense pins and the dynamic pins, inside or outside the cover of the housing. For example, where the cover of the housing comprises ends of a first height carrying the control terminals, and a low profile middle portion forming a recess or trough, the gate driver board is mounted within the recess or trough of the housing, e.g. within the footprint of the module, and below the height of the busbars. For higher reliability, ceramic decoupling capacitors are provided on the driver board, i.e. to place the capacitors further away from the heat source. Preferably components of the driver board such as decoupling capacitors are also low profile.

As an example, the features of this design approach allow for a power module comprising multiple paralleled high-speed power switching devices, with a gate driver board mounted thereon, to be configured to fit a standard power module form factor, such as a 62 mm module, i.e., a rectangular volume 62 mm×106 mm×30 mm in height. The low-profile middle portion allows for shorter, low inductance control terminals which are directly connected to control contact areas of the power substrate, to enable, high di/dt switching with reduced gate loop inductance compared to conventional power module configurations. A power module of an embodiment such as described with reference to FIGS. 7 to 22, and modifications and variants thereof, which is referred to as a "U-Module", provides options for a power module comprising paralleled GaN switches, which could be sized to retrofit existing systems, meeting current creepage and clearance standards, while providing improved performance, particularly with respect to reduced gate loop inductance and improved balancing of power commutation loop inductances. It will be appreciated that the specific embodiments are described in detail by way of example only. Variants and modifications are contemplated for half-bridge, full-bridge and other switching topologies using GaN HEMTs. For example, features of the different embodiments may be combined in various combinations to provide modifications of these embodiments.

Since GaN HEMTs turn on and off on a nanosecond time scale, reducing stray (parasitic) inductances, i.e. to reduce Ldi/dt transients, is important to improve or optimize performance. This is particularly important when multiple GaN switches are connected in parallel, and different path lengths of conductive interconnect traces introduce different inductances, and resistances, to cause imbalances in each gate drive loop and each power commutation loop. The design principles for power modules described herein are intended to reduce these parasitics. It is contemplated that these design principles may also be applicable to power modules for other fast wide-bandgap switching devices, e.g. SiC based power switching devices.

Figure 23:
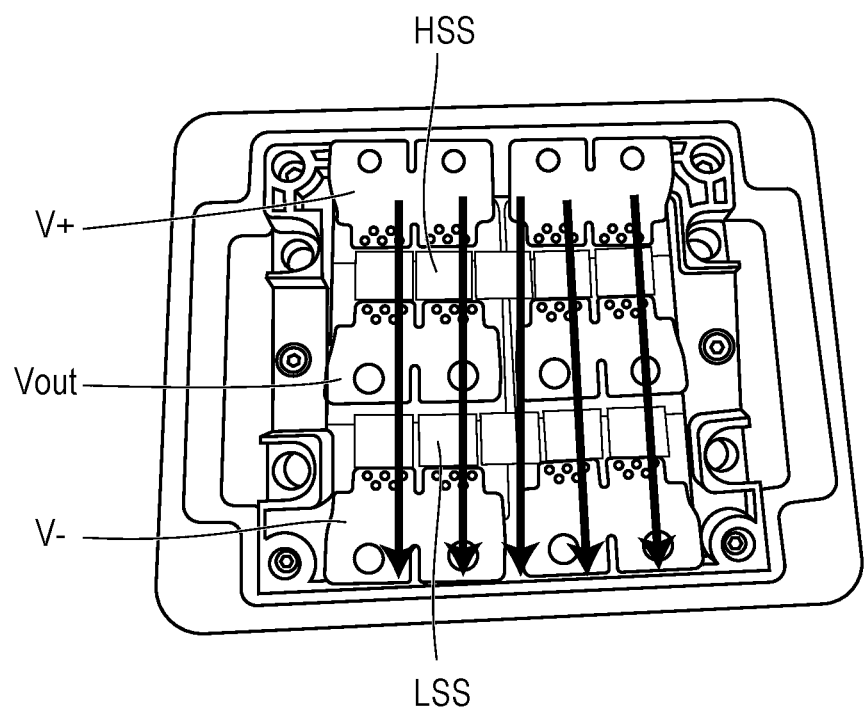
FIG. 23 shows a photograph of an example of a customized power module comprising a half-bridge configuration of a plurality of GaN switching devices connected in parallel, configured for a low inductance gate drive loop and with an arrangement of power terminals for balancing of power commutation loops.

FIG. 23 shows a photograph of a customized power module comprising a GaN HEMT half-bridge, comprising five HSS/LLS connected in parallel, in which the arrangement of the LSS and HSS GaN HEMTs and the configuration of power terminals is similar to that of the low profile power module shown in FIG. 3. This type of customized arrangement provides for balanced power commutation loops for each of the parallel-connected switches, as indicated schematically by the red arrows. However, customization of housing modules to optimize performance for each application, e.g. a half-bridge or full-bridge or other arrangement of GaN HEMTs, add significant design research and development time and costs, and tooling costs for customized modules are expensive. Power modules with non-standard dimensions and power terminal arrangements cannot readily be retro-fitted to existing/legacy power systems. That is, power modules having customized configurations are expensive to fabricate, and may not be compatible for retro-fitting existing systems. Thus, it is also desirable to provide modifications or improvements to existing housing type power modules, to meet performance requirements for GaN switching devices at lower cost.

Considering design principles applied for the example embodiments of the U-modules describe above, it will now be shown that these design principles can be applied for lower-cost modifications of commercially available housing type power modules for improved dynamic performance.

Figure 24:
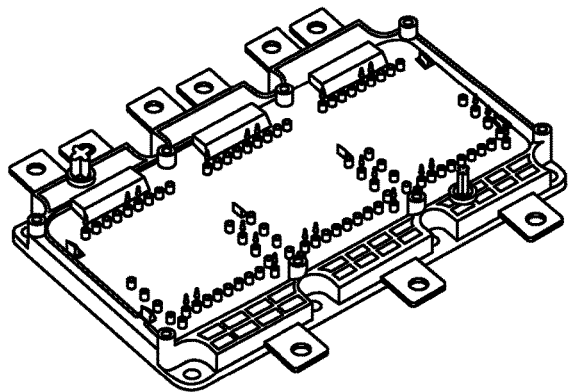
FIG. 24 shows a photograph of an external view of an example of a DBC power module type, in the form of an Infineon HybridPACK Drive Module™ for a 3-phase inverter.
Figure 25:
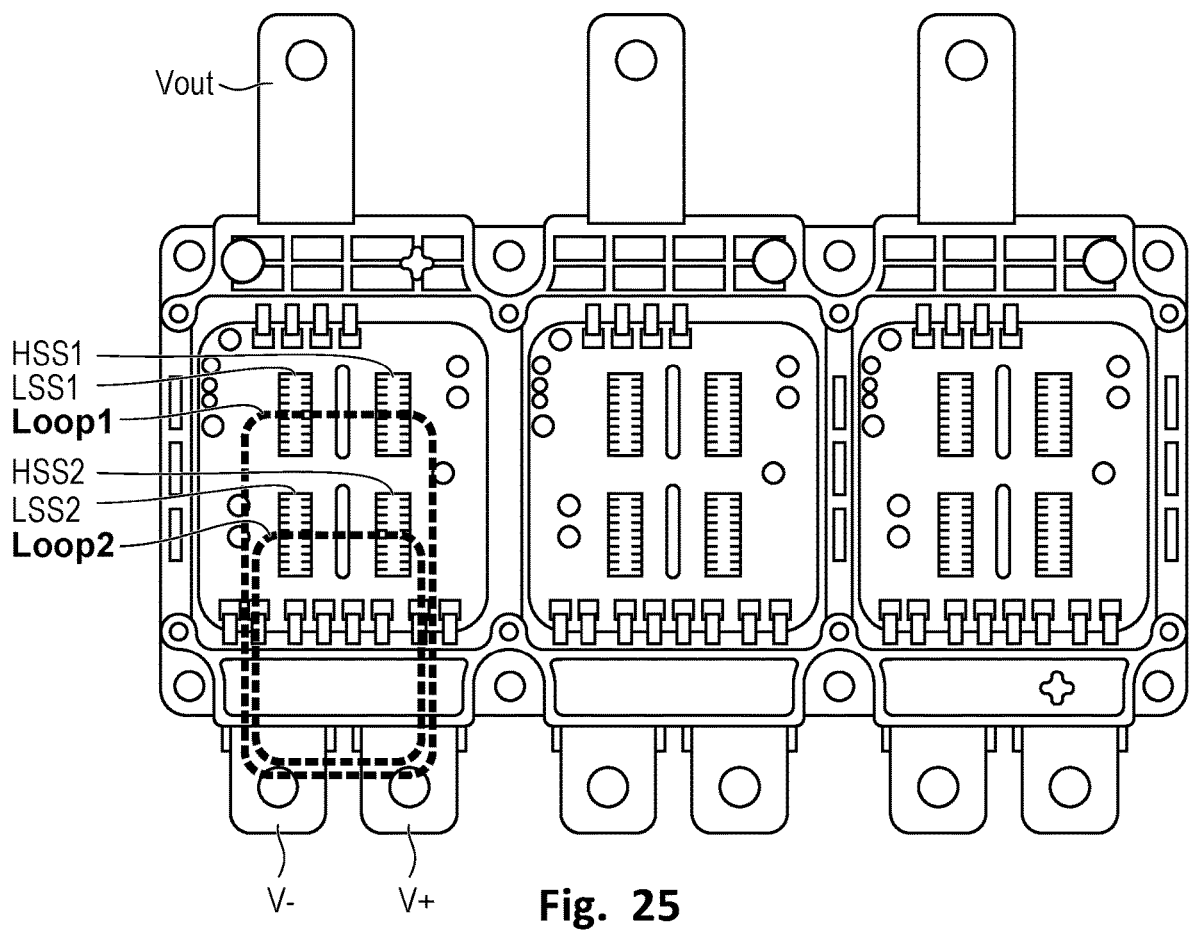
FIG. 25 shows a photograph of the power module of FIG. 24, with the cover removed to show the layout of internal components and power commutation lops.
Figure 26:
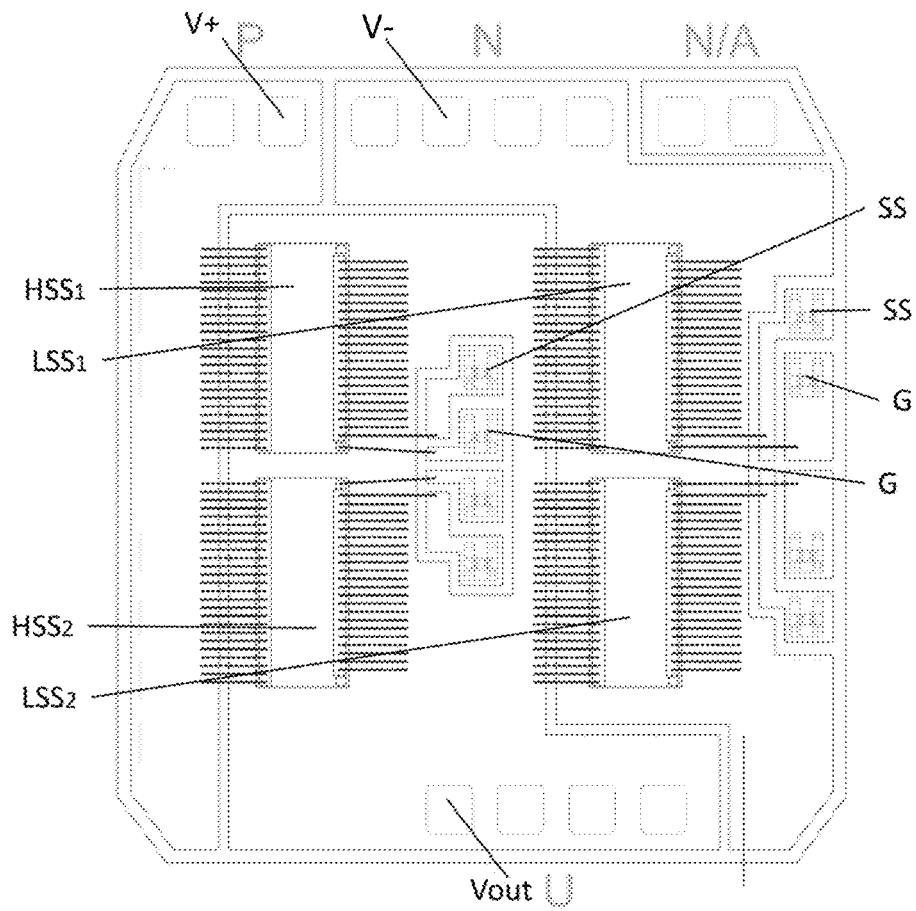
FIG. 26 shows a schematic diagram of a plan view of an example of the layout of the substrate, switching devices and their interconnections for one phase of the power module of FIG. 25.

For example, consider a three-phase inverter having an external package structure of a conventional form such as shown in FIG. 24, e.g. an Infineon HybridPACK Drive™ type power module, used for Si-IGBT or SiC switching devices, where multiple devices are connected in parallel to provide a required current switching capacity. FIG. 25 shows an example of this type of package adapted for use with two paralleled GaN HEMT switching devices, i.e. HSS1 and LSS1 and HSS2 and LSS2. In this type of substrate layout, as illustrated schematically by the dashed lines indicating the first power commutation loop Loop1 for HSS1 and LSS1 and the second power commutation loop Loop2 for HSS2 and LSS2, the power commutation loops are unbalanced, i.e. differ in parameters such as path length, inductance, resistance. FIG. 26 shows an enlarged schematic plan view to illustrate a conventional arrangement of a substrate and components and connections of one phase of the device structure shown in FIG. 25. This arrangement includes source sense SS pins and gate pins in close proximity to each LSS and HSS. However, as illustrated in FIG. 25, the arrangement of the power terminals introduces significant circuit parasitic inductance. For paralleling applications, the resulting quasi-common source inductance will cause oscillations.

Figure 27:
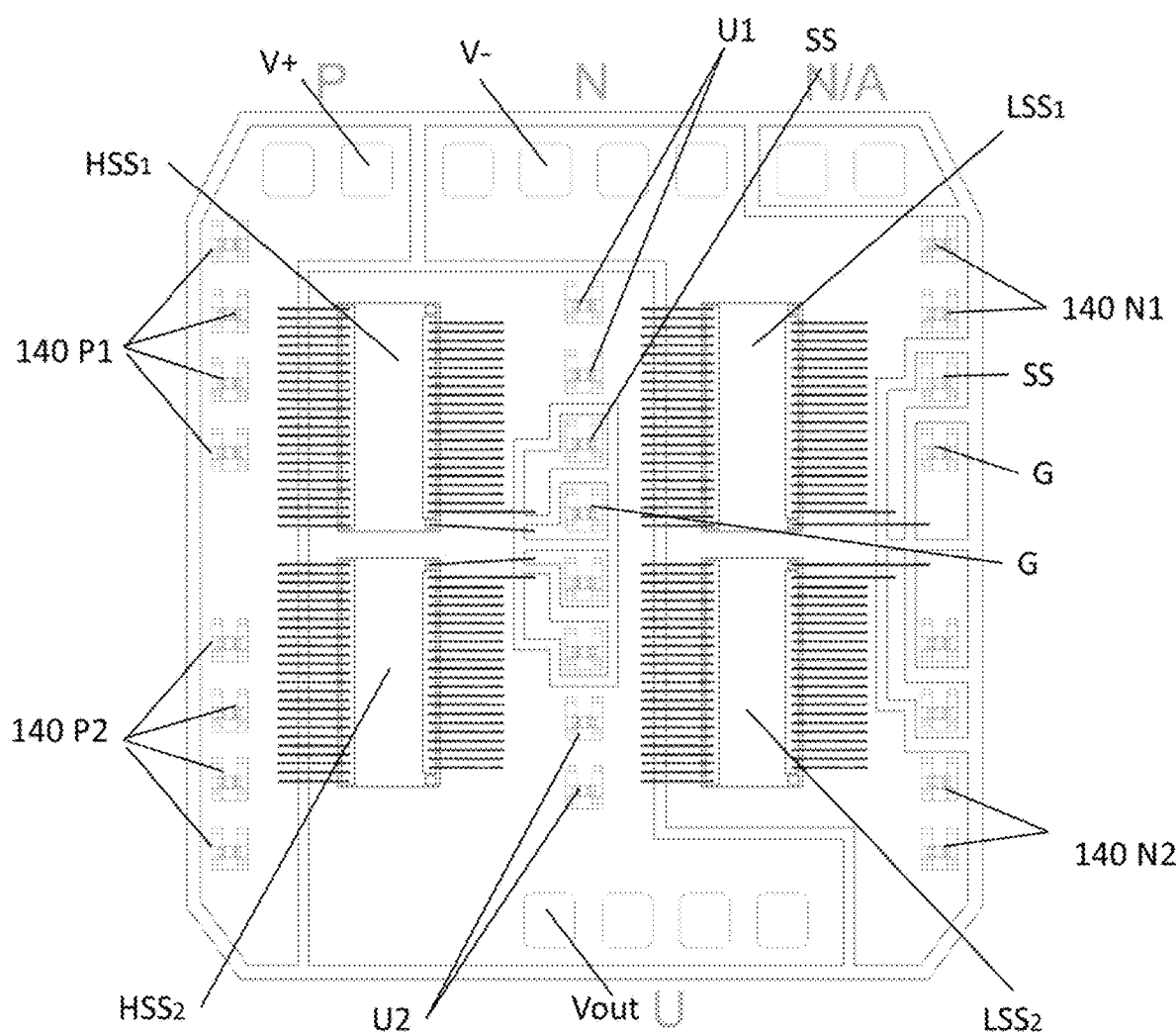
FIG. 27 shows a schematic diagram of a plan view of an embodiment of a power module of an embodiment wherein the layout of switching devices for one phase of the power module of FIG. 26, is configured with a plurality of dynamic pins connected to power tracks (buses) for balancing of power commutation loops of parallel connected GaN switching devices.

FIG. 27 shows a module which is modified to add additional pins for power connections to V+, V− and Vo, i.e. additional "dynamic performance pins" which are configured to provide a lower inductance path which balances the power commutation loop for parallel connected switching devices, as described with reference to FIGS. 14 and 15A for the power module of the first embodiment. The dynamic performance pins 140P and 140N to the high side drain and low side source are employed in an existing power module to redirect the high-frequency current without moving or reconfiguring the power terminals.

Figure 28:
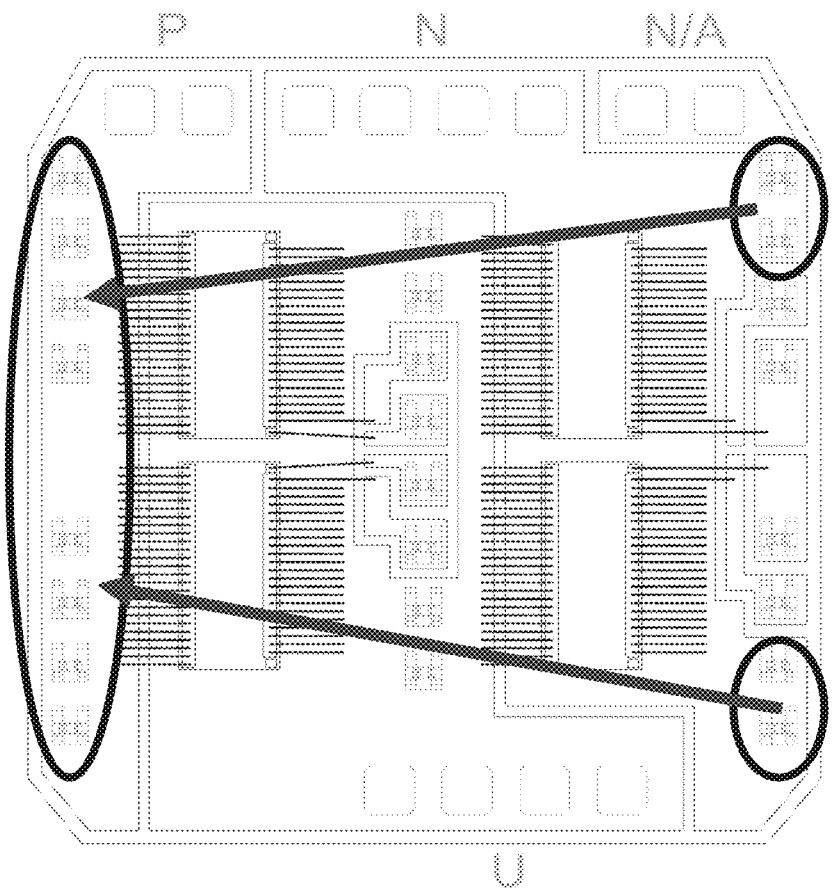
FIG. 28 shows a schematic diagram for further explanation of the function of the dynamic pins in balancing of power commutation loops of parallel connected GaN switching devices as shown in FIG. 27.

As illustrated schematically in FIG. 28, the additional dynamic pins provide for balancing of the inductance of the power commutation loop of each parallel connected GaN HSS/LSS switch. Addition of an arrangement of dynamic pins for the power buses is feasible as a simple, low-cost, modification to commercially available housing type modules that significantly reduces parasitic inductances in the power commutation loops. Although this design modification does not benefit from low-profile, low-inductance terminal members, so that the distance between the switching devices and the gate driver board is reduced, adding the dynamic performance pins to reduce the parasitic inductances in the power commutation loops does help to reduce the mutual inductance between the power loop and the gate drive loop.

It will be appreciated that housing type power modules of forms other than the HybridPACK Drive module may be similarly modified to add dynamic performance pins to reduce parasitic inductances in the power commutation loops. The power module may be configured so that the form factor of the housing, comprising the baseplate and the housing has the general form and geometry of an industry standard module, such as a 62 mm rectangular module with mounting holes at each end or at each corner, or any other industry standard form factor of other dimensions, with dynamic performance pins, to redirect high-frequency current. The dynamic performance pins can be readily implemented, at low cost. The addition of dynamic performance pins to existing forms of power modules provides for improved performance of parallel connected GaN switching devices, without requiring expensive customization and tooling.

Power modules of several embodiments have been described by way of example, comprising one or more features that offer improved performance, with at least one of reduced stray inductance of the gate loop circuit, and balancing of inductances in the power commutation loops of parallel connected power switching devices, to take advantage of ultra-fast switching capabilities of wide-bandgap semiconductor power switching devices, such as GaN HEMTs. Elements of power modules of one embodiment may be combined with elements of power modules of one or more of the other embodiments, to provide variants or modifications, or to provide power modules of alternative form factors. While examples of power modules configured for a half-bridge and for a full-bridge switch topology using GaN E-HEMTs have been described in detail above, it will be apparent that in other alternative embodiments, the power substrate may be configured for other well-known switch topologies comprising wide-bandgap semiconductor power switching devices, e.g. SiC or GaN transistors.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A power module for a wide-bandgap semiconductor power switching device, comprising:
   a housing comprising a baseplate and a cover;
   a power substrate in thermal contact with the baseplate, a topology of the power substrate being configured for mounting thereon of at least one wide-bandgap semiconductor power switching device, the power substrate comprising conductive tracks defining a plurality of power buses and control contact areas for each power switching device;
   a plurality of power terminal members, each power terminal member extending from one of the power buses on the power substrate, through the cover of the housing, to a power terminal at a first height $h_1$ from a base of the baseplate; and
   a plurality of terminal members comprising control terminal members extending from each of the control contact areas on the power substrate to a control terminal at a second height $h_2$ from the base, wherein the second height $h_2$ is less than the first height $h_1$.

2. The power module of claim 1, wherein the first height $h_1$ is selected to meet required creepage and clearance specifications and the second height $h_2$ is selected to provide low-profile control terminals for low stray inductance of a gate drive loop for each power switching device.

3. The power module of claim 1, wherein the control terminals comprise gate and source-sense terminals for the gate drive loop of each power switching device, wherein control contact areas for the gate and source-sense are located adjacent each power switching device and the gate and source-sense terminal members extend directly from said control contact areas to provide a low inductance signal path for a gate drive signal.

4. The power module of claim 3, wherein for wide bandgap semiconductor switching devices comprising GaN E-HEMTs, the gate and source-sense terminals provide said low inductance signal path for a gate drive signal having a stray inductance meeting specifications for high di/dt switching transitions, wherein turn-on and turn-off times of the GaN E-HEMTS are in a range of 1 ns to 10 ns.

5. The power module of claim 4, wherein said stray inductance is ≤10 nH.

6. The power module of claim 2, wherein said required clearance and creepage specifications provide for a busbar-to-heatsink distance for one of:
   ≥100V operation;
   300V to 400V operation;
   ≥600V operation; and
   ≥1200V operation.

7. The power module of claim 1, wherein the cover comprises a first portion and a second lower-profile portion, the power terminals extending through the first portion at the first height $h_1$ and the control terminals extending through the second lower-profile portion at the second height $h_2$, for mounting a gate driver board on the lower-profile portion of the housing, with the gate driver board connected to the control terminals.

8. The power module of claim 1, wherein the cover comprises end portions and a lower-profile middle portion defining a recess, the power terminals extending through the end portions of the housing at the first height $h_1$, and the control terminals extending through the lower-profile middle portion at the second height $h_2$, for mounting a gate driver board in the recess, with the gate driver board connected to the control terminals.

9. The power module of claim 1, wherein the topology of the power substrate is configured for mounting thereon of a plurality of wide-bandgap semiconductor switching devices connected in parallel, and a plurality of dynamic performance terminal members extending from the power buses, adjacent each power switching device, for connection to a gate driver board, the dynamic performance terminal members having an arrangement that balances inductances of power commutation loops of each power switching device and provides a low inductance path for high frequency current.

10. The power module of claim 1, comprising at least one of the following features:

wherein the height $h_2$ provides clearance above the power substrate for mounting of power switching devices on the power substrate, wherein each power switching device comprises a packaged GaN HEMT;

wherein height $h_1$ is ≥14 mm and $h_2$ is ≤4 mm and the height difference $h_1-h_2$ provides clearance for mounting of a gate driver board on the control terminals;

wherein height $h_1$ is ≥30 mm and $h_2$ is ≤4 mm and the height difference $h_1-h_2$ provides clearance for mounting of a gate driver board on the control terminals;

having a generally rectangular baseplate, having a width and length, wherein the power terminals are located at each end of the module and the control terminals are arranged in rows extending lengthwise along a middle portion of the module;

wherein the topology of the power substrate is configured for mounting thereon of a power switching device comprising a single wide-bandgap semiconductor power switching device;

wherein the topology of the power substrate is configured for mounting thereon of a power switching device comprising a plurality of wide-bandgap semiconductor power switching devices;

wherein the power substrate topology is configured for a single switch, a half-bridge, a full-bridge, or other switch topology;

wherein the power substrate topology is configured for a wide-bandgap semiconductor switching device comprising a single switch GaN E-HEMT;

wherein the power substrate topology is configured for a wide-bandgap semiconductor switching device comprising a plurality of GaN E-HEMTs;

wherein the power substrate topology is configured for a wide-bandgap semiconductor switching device comprising a GaN E-HEMT half-bridge; and wherein the power substrate topology is configured for a wide-bandgap semiconductor switching device comprising a GaN E-HEMT full-bridge.

11. A power module for wide-bandgap semiconductor switching device comprising:
a housing comprising a baseplate and a cover, the baseplate defining a footprint of generally rectangular form comprising ends having a width and sides having a length;
a power substrate in thermal contact with the baseplate, a topology of the power substrate being configured for mounting thereon of a plurality of semiconductor power switching devices arranged as first and second rows extending lengthwise, comprising a first row of high-side device positions and a second row of low-side device positions;
the power substrate comprising conductive tracks defining a plurality of power buses and a plurality of control contact areas for the switching devices, wherein
the plurality of power buses extend lengthwise adjacent to said first and second rows of high-side and low-side device positions;
first and second rows of control contact areas are arranged adjacent the first and second rows of high-side and low-side devices positions;
a plurality of power terminal members, each power terminal member extending from one of the power buses on the power substrate, through the cover of the housing to a power terminal at a first height $h_1$ from a base of the baseplate; and
a plurality of control terminal members, each control terminal member extending from one of the control contact areas on the power substrate to a control terminal at a second height $h_2$ from the base, wherein the second height $h_2$ is less than the first height $h_1$.

12. The power module of claim 11, wherein the control terminals comprise gate and source-sense terminals for each power switching device, and height $h_2$ is selected to provide low-profile control terminals for low stray inductance of a gate drive loop for each power switching device.

13. The power module of claim 11, wherein the control contact areas for the gate and source-sense of each power switching device are located adjacent each power switching device and the gate and source-sense terminal members extend directly from said control contact areas to provide a low inductance signal path for a gate drive signal.

14. The power module of claim 11, wherein the height $h_2$ provides clearance above the power substrate for mounting of power switching devices on the power substrate, and wherein each of the power switching devices comprises packaged GaN HEMT.

15. The power module of claim 11, wherein the first height $h_1$ is selected to meet required clearance and creepage specifications for the power terminals.

16. The power module of claim 11 wherein the first height $h_1$ is ≥14 mm and the second height $h_2$ is ≤4 mm, the first height $h_1$ being selected to meet required clearance and creepage specifications for the power terminals.

17. The power module of claim 11, wherein the cover comprises end portions and a lower-profile middle portion defining a recess, the power terminals extending through the end portions at the first height $h_1$ and the control terminals extending through the lower-profile middle portion at the second height $h_2$, for mounting of a gate driver board in the recess with the gate driver board connected to the control terminals.

18. The power module of claim 11, wherein the topology of the power substrate is configured for one of: a single switch, a half-bridge, and a full-bridge.

19. The power module of claim 11, wherein the power buses and control contact areas configured for a single switch topology, and further comprising at least one GaN E-HEMT mounted on the power substrate to form the single switch.

20. The power module of claim 11, wherein the power buses and control contact areas of the power substrate are configured for a single switch topology, and further comprising a plurality of GaN E-HEMTs mounted on the power substrate and connected in parallel to form the single switch.

21. The power module of claim 11, wherein the power buses and control contact areas of the power substrate are configured for a half-bridge topology, and further comprising a plurality of GaN E-HEMTs mounted in the first row of high-side device positions and the second row of low-side device positions, and interconnected to form the half-bridge.

22. The power module of claim 11, wherein the power buses and control contact areas of the power substrate are configured for a full-bridge topology, and further comprising a plurality of GaN E-HEMTs mounted in the first row of high-side device positions and the second row of low-side device positions and interconnected to form the full-bridge.

23. The power module of claim 11 wherein each switch position comprises a plurality of said GaN E-HEMTs connected in parallel.

24. An assembly of the power module of claim 11 with a gate driver control board comprising gate driver circuitry for each of the GaN E-HEMTs, wherein the gate driver control board is mounted on the power module and connected to the gate and source-sense control terminals of the power module to form a gate control loop, wherein the gate control loop is configured to provide a stray inductance of the gate control loop circuit in a range from 30 nH to less than 5 nH, which meets specifications for operation at a switching frequency in a range from 10 kHz to 2 MHz.

25. An assembly of the power module of claim 11 with a gate driver control board comprising a gate driver circuitry for each of the GaN E-HEMTs, wherein the gate driver control board is mounted on the power module and connected to the gate and source-sense control terminals of the power module to form a gate control loop, wherein the gate control loop is configured to provide a stray inductance of the gate control loop circuit having a value in a range which meets specifications for high di/dt switching transitions wherein turn-on and turn-off times of the GaN E-HEMTS are in a range of 1 ns to 10 ns.

26. The assembly of claim 25, wherein said value of the stray inductance of the gate control loop circuit is ≤10 nH.

* * * * *